(12) United States Patent
Jeoung et al.

(10) Patent No.: US 9,997,112 B2
(45) Date of Patent: Jun. 12, 2018

(54) DISPLAY DEVICE

(71) Applicant: LG DISPLAY CO., LTD., Seoul (KR)

(72) Inventors: Hun Jeoung, Paju-si (KR); Sang Hee Yu, Paju-si (KR); Sung Hyun Cho, Seoul (KR); Bo Sun Lee, Cheongju-si (KR); Sung Wook Chang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 11 days.

(21) Appl. No.: 15/124,954

(22) PCT Filed: Mar. 10, 2015

(86) PCT No.: PCT/KR2015/002313
§ 371 (c)(1),
(2) Date: Sep. 9, 2016

(87) PCT Pub. No.: WO2015/137709
PCT Pub. Date: Sep. 17, 2015

(65) Prior Publication Data
US 2017/0025068 A1    Jan. 26, 2017

Related U.S. Application Data

(60) Provisional application No. 61/950,698, filed on Mar. 10, 2014.

(51) Int. Cl.
| | | |
|---|---|---|
| G09G 3/3266 | (2016.01) | |
| G09G 3/36 | (2006.01) | |
| G11C 19/28 | (2006.01) | |
| G09G 3/3258 | (2016.01) | |
| G09G 3/3291 | (2016.01) | |

(Continued)

(52) U.S. Cl.
CPC ......... *G09G 3/3266* (2013.01); *G09G 3/3258* (2013.01); *G09G 3/3291* (2013.01); *G09G 3/3614* (2013.01); *G09G 3/3677* (2013.01); *G09G 3/3688* (2013.01); *G09G 3/3696* (2013.01); *G11C 19/00* (2013.01); *G11C 19/28* (2013.01); *G09G 3/20* (2013.01); *G09G 3/32* (2013.01); *G09G 2310/02* (2013.01); *G09G 2310/021* (2013.01); *G09G 2310/0213* (2013.01); *G09G 2310/0224* (2013.01);
(Continued)

(58) Field of Classification Search
None
See application file for complete search history.

(56) References Cited

U.S. PATENT DOCUMENTS

| | | |
|---|---|---|
| 2001/0017611 A1 | 8/2001 | Moriyama |
| 2004/0036669 A1 | 2/2004 | Yanagi et al. |

(Continued)

FOREIGN PATENT DOCUMENTS

| | | |
|---|---|---|
| KR | 2001-0085723 A | 9/2001 |
| KR | 10-2008-0067091 A | 7/2008 |

(Continued)

*Primary Examiner* — Kenneth B Lee, Jr.
(74) *Attorney, Agent, or Firm* — Birch, Stewart, Kolasch & Birch, LLP

(57) ABSTRACT

Present invention is related to a display device and a driving method thereof. In particularly, the present invention is to provide a display device and a driving method thereof, in which a data driver driven at a low frequency which is capable of inverting a polarity of a data voltage in each frame.

19 Claims, 18 Drawing Sheets

(51) Int. Cl.
  *G11C 19/00*  (2006.01)
  *G09G 3/20*  (2006.01)
  *G09G 3/32*  (2016.01)

(52) U.S. Cl.
  CPC ............... *G09G 2310/0286* (2013.01); *G09G 2310/0291* (2013.01); *G09G 2340/0435* (2013.01)

(56) References Cited

U.S. PATENT DOCUMENTS

| | | |
|---|---|---|
| 2004/0104873 A1 | 6/2004 | Kang et al. |
| 2007/0296676 A1 | 12/2007 | Moon et al. |
| 2008/0170025 A1 | 7/2008 | Song et al. |
| 2009/0237391 A1 | 9/2009 | Yanagi et al. |
| 2010/0109996 A1 | 5/2010 | Park et al. |
| 2012/0032935 A1 | 2/2012 | Yen |
| 2013/0286300 A1 | 10/2013 | Lee |
| 2014/0028657 A1 | 1/2014 | Kobayashi et al. |
| 2014/0049512 A1 | 2/2014 | Yang et al. |
| 2014/0092070 A1* | 4/2014 | Kim ................... G09G 3/3614 345/209 |
| 2014/0368484 A1 | 12/2014 | Tanaka et al. |

FOREIGN PATENT DOCUMENTS

| | | |
|---|---|---|
| KR | 10-2013-0056410 A | 5/2013 |
| KR | 10-2013-0130410 A | 12/2013 |

\* cited by examiner (a)

(b)

DISPLAY DEVICE

CROSS-REFERENCED TO RELATED APPLICATIONS

This application is the National Phase of PCT International Application No. PCT/KR2015/002313, filed on Mar. 10, 2015, which claims priority under 35 U.S.C. 119(e) to U.S. Provisional Application No. 61/950,698, filed on Mar. 10, 2014. All of which are hereby expressly incorporated by reference into the present application.

BACKGROUND OF THE INVENTION

Field of the Invention

The present invention relates to a display device, and particularly, to a display device for reducing defects such as image sticking, smears, etc., which are caused by accumulation of direct current (DC) voltages.

Description of the Related Art

A flat panel display (FPD) device is applied to various kinds of electronic devices such as mobile phones, tablet personal computers (PCs), laptop computers, etc. Examples of the FPD device include liquid crystal display (LCD) devices, plasma display panels (PDPs), organic light emitting display devices (OLED), etc. Recently, electrophoretic display (EPD) devices are being widely used too.

In such FPD devices (hereinafter simply referred to as a display device), the LCD devices are devices that display an image by using the optical anisotropy of liquid crystal. The LCD devices have good features such as thinness, compact shape, low consumption power, high image quality, etc., and thus are being widely used.

Further, in the display devices, the organic light emitting display devices use a self-emitting device that self-emits light, and thus have a fast response speed, high emission efficiency, high luminance, and a wide viewing angle. Therefore, the organic light emitting display devices are attracting much attention as the next-generation FPD devices.

Generally, the display device includes a panel for displaying an image, a gate driver for sequentially supplying a scan pulse to a plurality of gate lines provided in the panel, a data driver for supplying data voltages to a plurality of data lines provided in the panel, and a timing controller for controlling the gate driver and the data driver.

The gate driver may be implemented as an integrated circuit (IC) type and may be provided in a non-display area of the panel. Alternatively, the gate driver may be provided independently from the panel and may be electrically connected to the panel in various types, for example, a chip-on film (COF) type.

Recently, a gate-in panel (GIP) type where the gate driver is equipped in the panel is being widely used. The gate driver is a shift register including a plurality of stages that sequentially output a scan signal to the gate lines provided in the panel in synchronization with a certain clock. An ordinary gate driver repeatedly performs an operation, where first to last stages sequentially output the scan signal according to the same period, at every frame.

In the display device that displays various kinds of images, in order to satisfy a temporary driving condition, the gate driver is always driven at a high frequency, or the gate driver is driven in order for all the stages to sequentially output the scan signal, may cause waste of consumption power.

Moreover, in a related art display device, since the scan signal is sequentially output from all the stages at the constant frequency, performing of additional functions such as touch sensing, fingerprint recognition, and/or the like can be limited. It may be advantageous that the additional functions such as the touch sensing or the fingerprint recognition may be performed when the gate driver does not output the scan signal. Accordingly, operations for the additional functions are performed at a blank time between two frames. In order to further secure a time necessary for performing the additional functions, a period where an image is displayed in each frame period should be reduced. However, by doing such can reduce a pixel charging time, and a deterioration in an image quality such as flicker may occur due to noise and pixel coupling caused by performing the additional functions.

SUMMARY OF THE INVENTION

The present invention is proposed to obviate the above-described problems and other limitations associated with the related art, and the technical solution is to provide a display device, in which a data driver, driven at a low frequency, is capable of inverting the polarity of the data voltage in each frame.

To solve or address the technical problems described above and other limitations associated with the related art, there is provided a display device according to an embodiment of the present invention including a gate driver configured to apply a scan signal to a plurality of gate lines at a first period in a first mode and configured to apply the scan signal to the plurality of gate lines at a second period slower than the first period in a second mode according to a driving speed control signal and a data driver inverting a polarity of a data voltage and outputting the data voltage during a scan signal output period, and not outputting the data voltage to a plurality of data lines during a scan signal control period for each frame, wherein a period of one frame of the second mode according to the driving speed control signal includes the scan signal output period for outputting the scan signal to the plurality of gate lines and the scan signal control period for not outputting the scan signal to the plurality of gate lines.

To solve or address the technical problems described above and other limitations associated with the related art, there is provided another display device according to an embodiment of the present invention including a display area including a first driving area driven at a first frequency and a second driving area driven at a second frequency lower than the first frequency, a gate driver configured to apply a scan signal to a plurality of gate lines of the first driving area and the second driving area according to the first frequency and the second frequency and a data driver configured to supply a data voltage, with respect to recharging a plurality of pixels within the second driving area with a certain data voltage, said data voltage supplied from the data driver having an opposite polarity from that of a charged data voltage of the second driving area.

According to one or more embodiments of the present invention, in the display device which is driven at a low frequency, defects such as image sticking and smears are not caused by accumulation of DC voltages.

Moreover, according to one or more embodiments of the present invention, since power supplied to the data driver is cut off in the data voltage non-output period where a data voltage is not output, the consumption power of the data driver is reduced.

DETAILED DESCRIPTION OF THE EMBODIMENTS

Hereinafter, exemplary embodiments of the present invention will be described in detail with reference to the accompanying drawings.

Hereinafter, for convenience of description, an LCD device will be described as an example of the present invention, but the present invention is not limited thereto. That is, the present invention may be applied to organic light emitting display devices.

Figure 1:
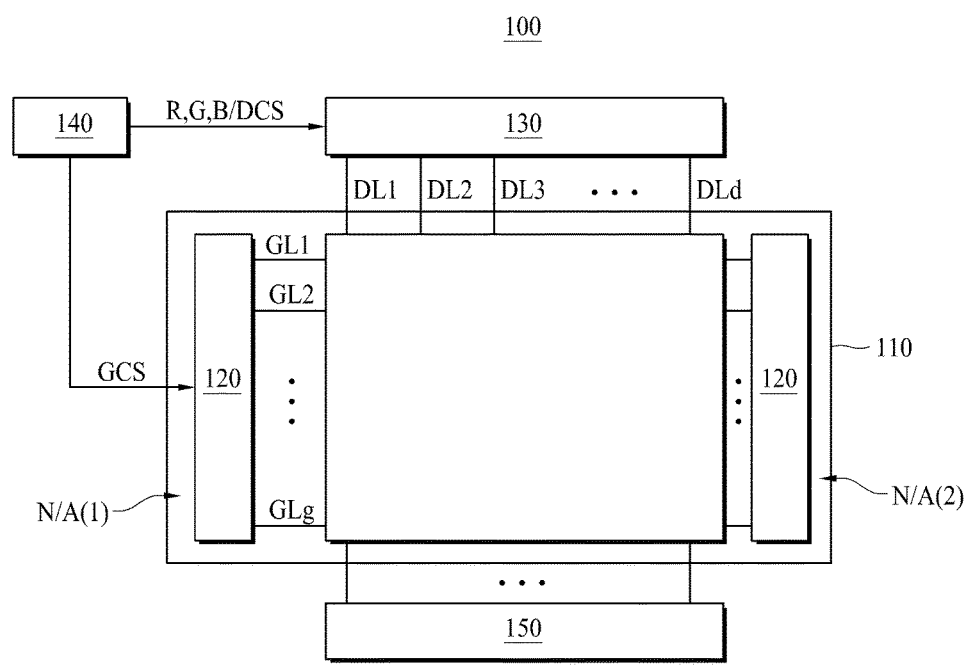
FIG. 1 is an exemplary diagram illustrating a configuration of a display device according to an embodiment of the present invention.

FIG. 1 is an exemplary diagram illustrating a configuration of a display device according to the present invention. Referring to FIG. 1, a display device 100 includes a panel 110 that includes a display area A/A, where a plurality of pixels P are provided and display an image, and a non-display area N/A disposed outside the display area A/A. Also, the display device 100 includes a gate driver 120, which outputs a scan signal to the plurality of pixels P through a plurality of gate lines GL1 to GLg, and a data driver 130 that supplies data voltages to the plurality of pixels P through a plurality of data lines DL1 to DLd. The gate driver 120 and the data driver 130 may be included in the panel 110. Signals for controlling the gate driver 120 and the data driver 130 may be supplied from a timing controller 140.

The display device 100 according to the present invention may or may not include a touch sensing function. If the display device 100 includes the touch sensing function, a plurality of touch electrodes is included in the panel 110, and the display device 100 may include a touch driver 150 that supplies a touch voltage to the touch electrodes to determine whether there is a touch. If the display device 100 does not include the touch sensing function, the touch electrodes and the touch driver 150 may be omitted.

The panel 110 performs a function of displaying an image. The panel 110 may be changed depending on the kind of the display device 100, and particularly, if the display device 100 is an LCD device, the panel 110 may be a liquid crystal panel where a liquid crystal layer is provided between two substrates. In this case, the plurality of data lines DL1 to DLd, the plurality of gate lines GL1 to GLg, and a plurality of thin film transistors (TFTs) electrically connected to the data lines DL1 to DLd and the gate lines GL1 to GLg to drive the pixels P are included in one substrate of the substrates configuring the liquid crystal panel. The panel 110 includes a plurality of pixel electrodes for charging data voltages and a common electrode for driving liquid crystal filled into the liquid crystal layer along with the pixel electrodes. In the panel 110, the pixels are disposed in a matrix type, and a black matrix BM and a color filter are disposed depending on a structure of the pixels.

As described above, the panel 110 may be configured with an organic light emitting panel. In this case, each of the pixels included in the panel 110 may include an organic light emitting diode (OLED), a plurality of TFTs that are connected to a corresponding data lines DL and a corresponding gate lines GL to control the OLED, and a storage capacitor. As described above, some embodiments described in the present specification may be applied to various kinds of panels in addition to a liquid crystal panel and an organic light emitting panel.

The gate driver 120 supplies the scan signal to the gate lines by using a plurality of gate control signals GCS transferred from the timing controller 140. In the present specification, the scan signal refers to a signal for turning on a switching TFT connected to a corresponding gate line. Also, a signal for turning off the switching TFT is referred to as a gate-off signal. A generic name for the scan signal and the gate-off signal is a gate signal. If the switching TFT is an N type, the scan signal is a high-level voltage, and the gate-off signal is a low-level voltage. On the other hand, if the switching TFT is a P type, the scan signal is a low-level voltage, and the gate-off signal is a high-level voltage.

In the present specification, it is described that the gate driver 120 is provided in a GIP type where the gate driver 120 is mounted in at least one non-display area N/A of the panel 110, and an output terminal of the gate driver 120 is electrically connected to the plurality of gate lines provided in the display area A/A. The gate driver 120 may be disposed on one side of the panel 110. Alternatively, as illustrated in FIG. 1, the gate driver 120 may be provided as two, and the two gate drivers 120 may be disposed on both sides of the panel 110. In this case, the gate drivers 120 may be configured as an interlace type where one gate driver 120 applies the scan signal to pixels corresponding to odd lines, and another gate driver 120 applies the scan signal to pixels corresponding to even lines. Also, in some embodiments, the one gate driver 120 may apply the scan signal to pixels disposed in one area of the panel 110, and the other gate driver 120 may apply the scan signal to pixels disposed in another area of the panel 110.

A driving speed control signal for varying a driving speed may be supplied to the gate driver 120. When the gate driver 120 varies a period at which the scan signal is output, a refresh rate of the panel 110 varies. That is, a time taken until the pixels are recharged with new data voltages may increase or decrease. For example, the pixels may be recharged with data voltages sixty times for one second, and then, may be recharged thirty times for one second. That is, the panel 110 which is driven at 60 FPS may be driven at 30 FPS. In this case, a time taken until the pixels are again charged after the pixels are charged with the data voltages increases from 16.7 ms to 33.3 ms.

Hereinafter, the gate driver 120 will be described in detail with reference to FIGS. 1 to 10.

According to some embodiments of the present invention, the gate driver 120 may control the number of external start signals for starting to drive a shift register and a timing when the external start signals are applied, and thus, a period at which the pixels of the display device 100 are charged with data voltages may vary. That is, driving of the shift register may be stopped for a certain duration by varying a period at which the external start signal is supplied to the shift register, thereby varying a period at which the scan signal is output to the gate line. For example, during one second period, the gate driver 120 may output scan signal from 240 times to 1 time to each of the gate lines.

In a case of varying an output of the scan signal to each of the gate lines by using the external start signal, the gate driver 120 may include a stage group, which starts to be driven by a first external start signal (Start1 or Initial VST), and a plurality of stage groups which start to be driven by other external start signals different from the first external start signal. In this case, each of the stage groups includes a plurality of stages which sequentially output the scan signal. That is, the stages included in each stage group sequentially output the scan signal to form a separate driving area. For example, a plurality of stages included in a first stage group sequentially output the scan signal to gate lines connected to pixels in a first driving area, and a plurality of stages included in a second stage group sequentially output the scan signal to gate lines connected to pixels in a second driving area. As an individual external start signal is applied to each of the stage groups, the display area may be divided into a plurality of driving areas, which may be driven. Therefore, during one second period, each of the stage groups may output scan signal from 240 times to 1 time to gate lines disposed in some driving areas and may output other scan signal from 240 times to 1 time to gate lines disposed in another driving area during one second period.

Figure 2:
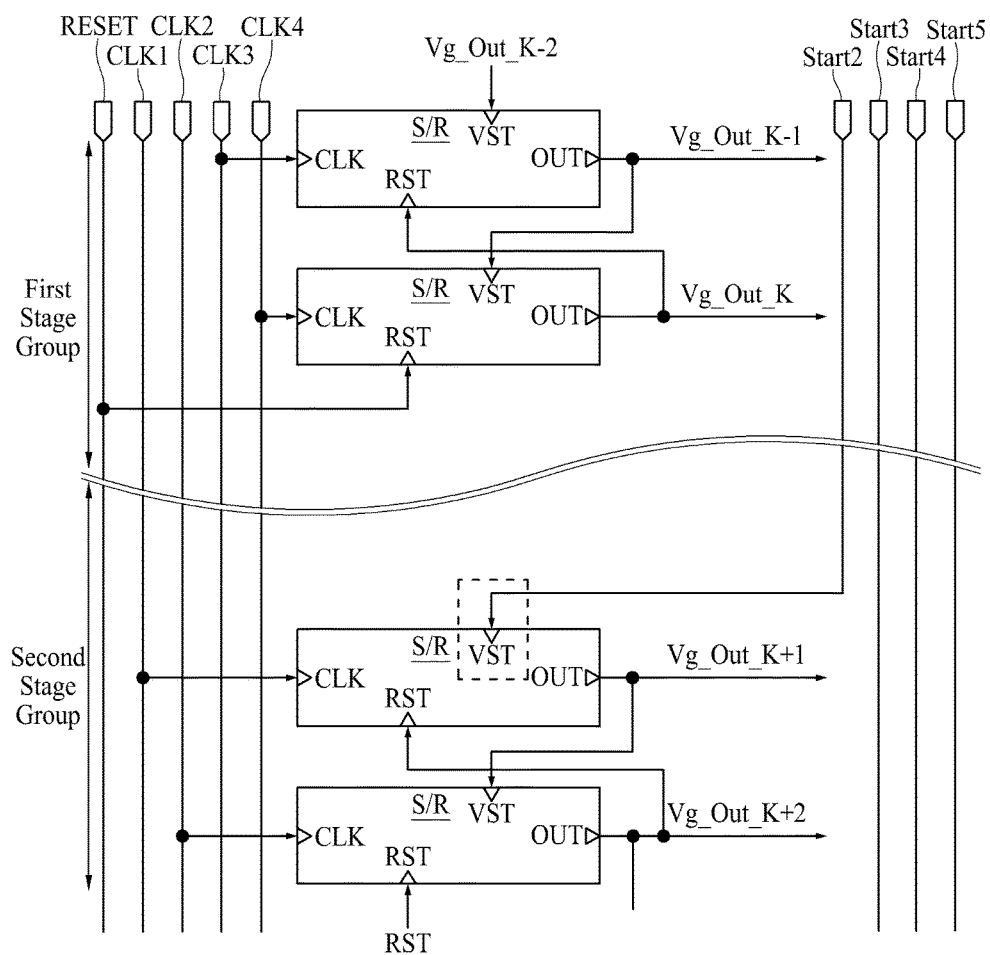
FIG. 2 is an exemplary diagram illustrating a configuration of a gate driver for realizing the driving method according to an embodiment of the present invention.
Figure 3:
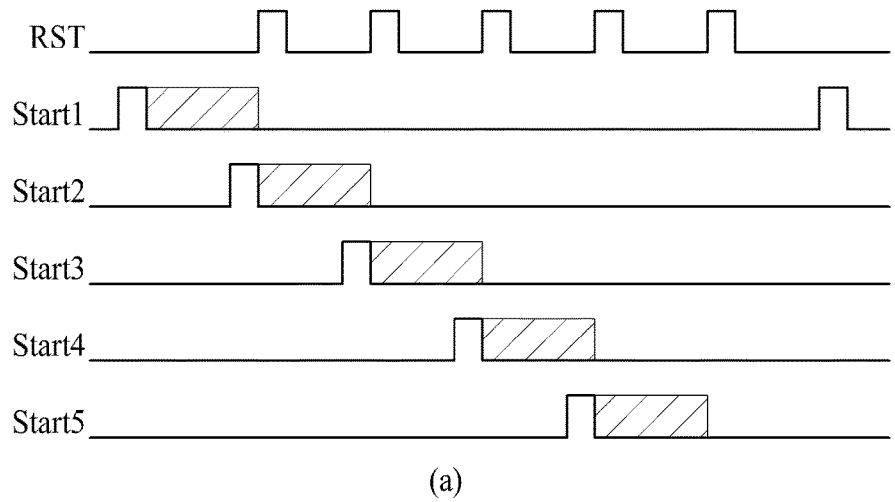
FIG. 3 is an exemplary diagram showing waveforms of signals applied to the gate driver illustrated in FIG. 2.
Figure 3:
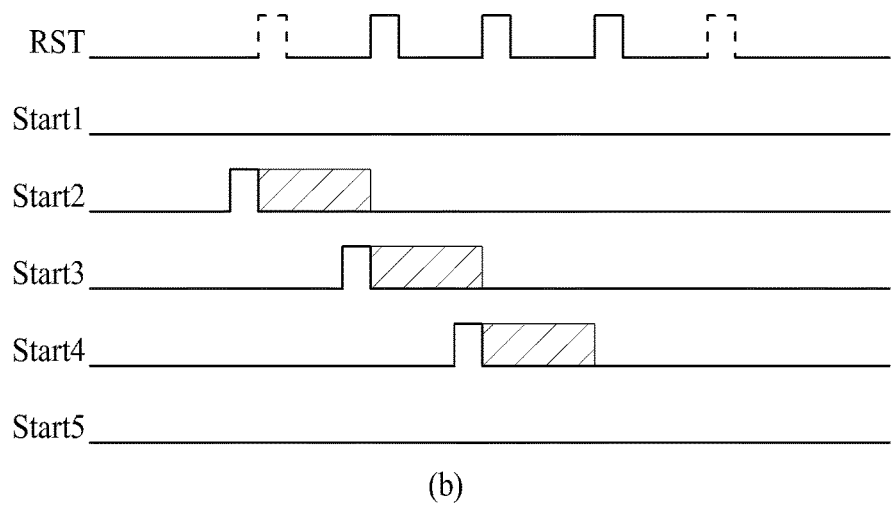

FIG. 2 is an exemplary diagram illustrating a configuration of a gate driver for realizing the above-described driving method, and FIG. 3 is an exemplary diagram showing waveforms of signals applied to the gate driver illustrated in FIG. 2.

When a first stage group corresponds to a driving area disposed in an uppermost end of a display area, the first stage group starts to be driven by a basic external start signal Start1. Each of external start signals is supplied to a VST terminal of a first stage, disposed in an area where a screen is divided, among a plurality of stages included in each of first to fifth stage groups. In each stage group, stages other than a stage which receives the external start signal through an external start signal line may receive a scan signal, which is output from another stage of a stage group including the stages, as a start signal and may receive a scan signal as a reset signal from a stage disposed in a rear end, whereby the stages may be driven.

To provide a description with reference to FIG. 2, a scan signal output from a K−2 stage is applied as a start signal to a VST terminal of a K−1 stage, and a scan signal output from the K−1 stage is input to a reset terminal RST of the K−2 stage to reset the K−2 stage. In other words, stages other than a stage driven by the external start signal supplied thereto among the stages of the first stage group is supplied with an output of a stage, driven prior to each of the stages, through the VST terminal and is driven according to the supplied output. Therefore, the scan signal is sequentially output from the stages of the first stage group.

However, an output of a K stage included in the first stage group is not applied as a start signal of a K+1 stage included in the second stage group. Therefore, the second stage group does not start to drive until the external start signal is applied through a separate external start signal line. In this case, the scan signal is not output from the K+1 stage, and thus, the K stage which is a last stage of the first stage group is reset by an external reset signal applied through an external reset signal line. That is, each stage group includes one or more stages, which are driven by the external start signal supplied through the external start signal line, and one or more stages which are reset by the external reset signal supplied through the external reset signal line.

When a second external start signal is input to the second stage group, an output of a stage which is supplied with the second external start signal and is driven by the second external start signal is supplied to a VST terminal of another stage of the second stag group, and thus, stages of the second stage group is sequentially driven. Other stage groups of the gate driver are each provided in an independent structure like the first stage group and the second stage group.

For divisional driving, each stage group receives a start signal through an independent start signal line. However, the external reset signal supplied to the stage groups may be applied through the external reset signal line shared by the stage groups.

If the gate driver 120 is configured as illustrated in FIG. 2, the display device may be driven by waveforms shown in FIG. 3. FIG. 3 in (a) shows waveforms of the external start signals and the external reset signal when first to fifth driving areas are all driven by the external start signals, and all driving areas of the panel may be sequentially driven by the waveforms shown in (a) of FIG. 3.

To provide a detailed description, when first to fifth external start signals Start 1 to Start 5 are sequentially supplied to the first to fifth stage groups during one frame period, the scan signal is sequentially output to the gate lines provided in all of five driving areas. That is, if divisional driving of a screen is not needed, as in (a) of FIG. 3, by adjusting a timing when the external start signal is applied to each stage group, all the stages of the gate driver may be driven like being driven by one external start signal. In other words, a timing when the external start signal is applied to each stage group may be adjusted so that an output of a previous stage is the same as being sequentially input as a start signal, and thus, the display area may be wholly driven. Therefore, pixels provided in all the driving areas are charged with data applied through data lines.

FIG. 3 in (b) shows waveforms of the external start signals and the external reset signal when only stage groups corresponding to a driving area including pixels which are to be charged with new data voltages are driven, and other stage groups are not driven. As shown in (b) of FIG. 3, during one frame period, when the external start signal is supplied to the second to fourth stage groups without being supplied to the first stage group and the fifth stage group, the second to fourth driving areas are driven. Therefore, an image is displayed through only the second to fourth driving areas. That is, a driving area displaying an image may be variously changed by supplying the external start signal to only some stage groups. According to some embodiments of the present invention, even when the gate driver 120 is driven, a period at which the pixels of the display device are charged with data voltages may vary by controlling an output of the scan signal to the gate lines according to the enable signal. For example, the gate driver 120 may include a blocking unit that discharges output terminals of stages, connected to the gate lines, to a low-level voltage source according to the enable signal.

Figure 4:
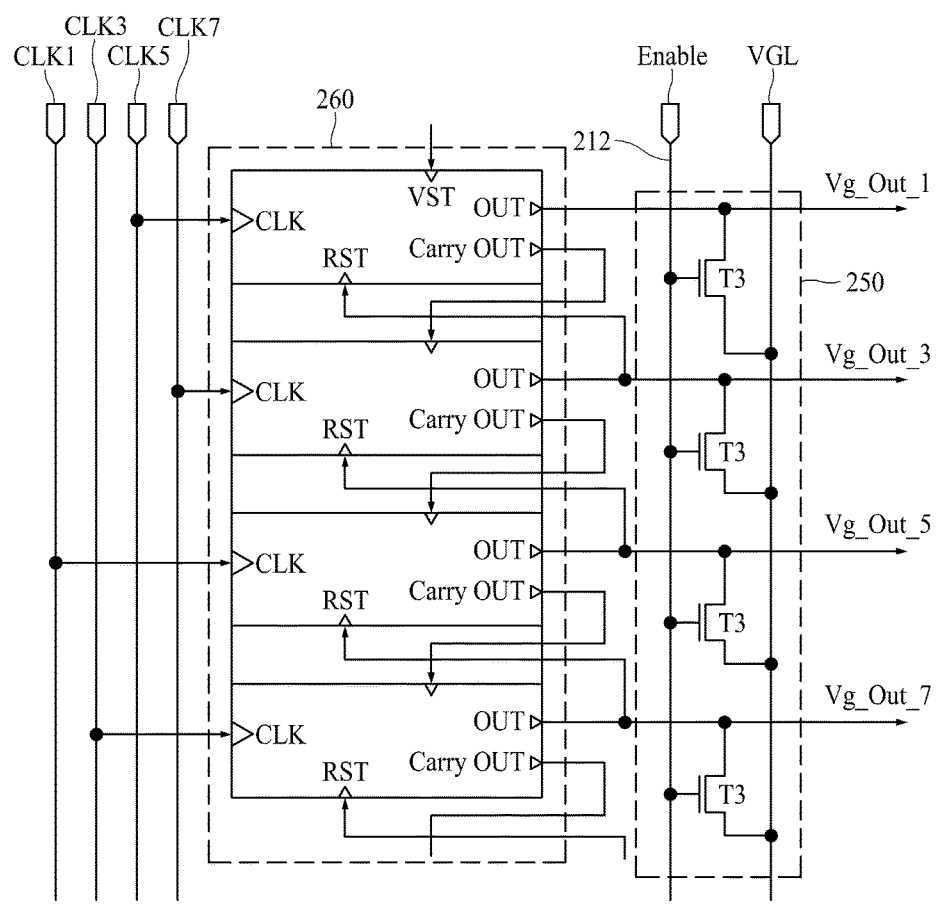
FIG. 4 is an exemplary diagram illustrating an example of a gate driver which restricts an output of a scan signal to a gate line by using an enable signal, according to some embodiments of the present invention.
Figure 5:
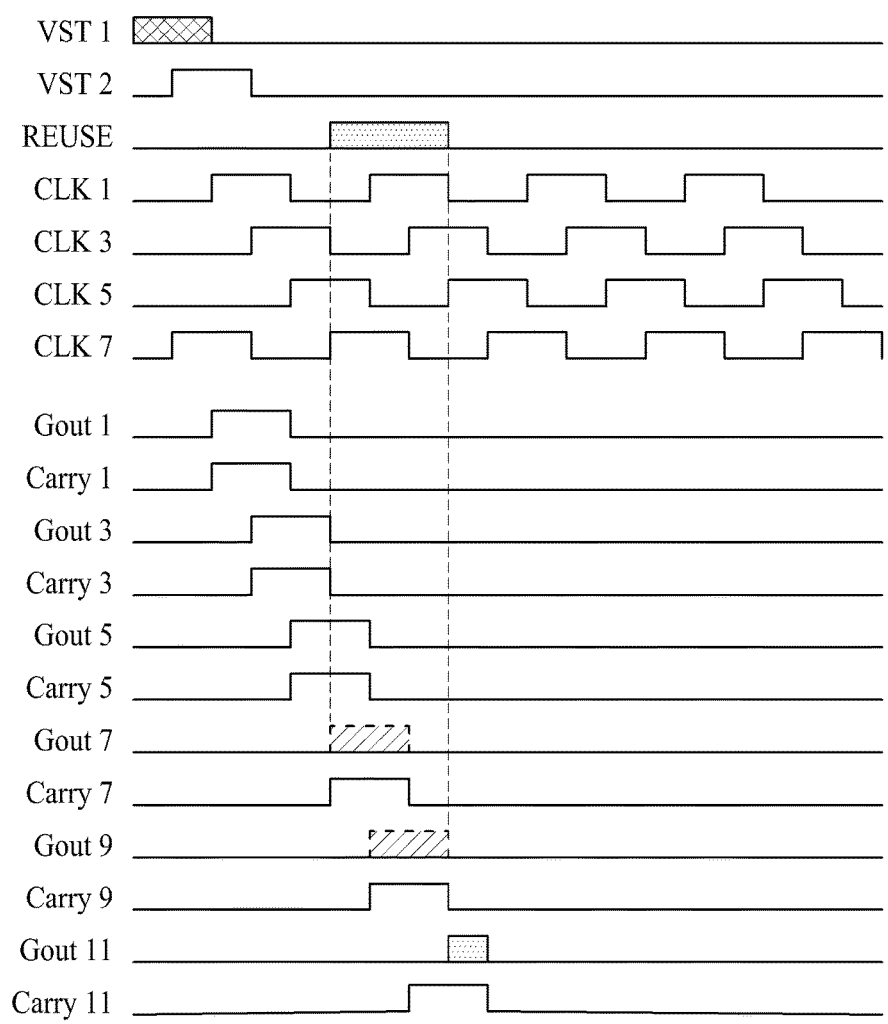
FIG. 5 is an exemplary diagram showing waveforms of signals applied to a display device according to an embodiment of to the present invention.
Figure 6:
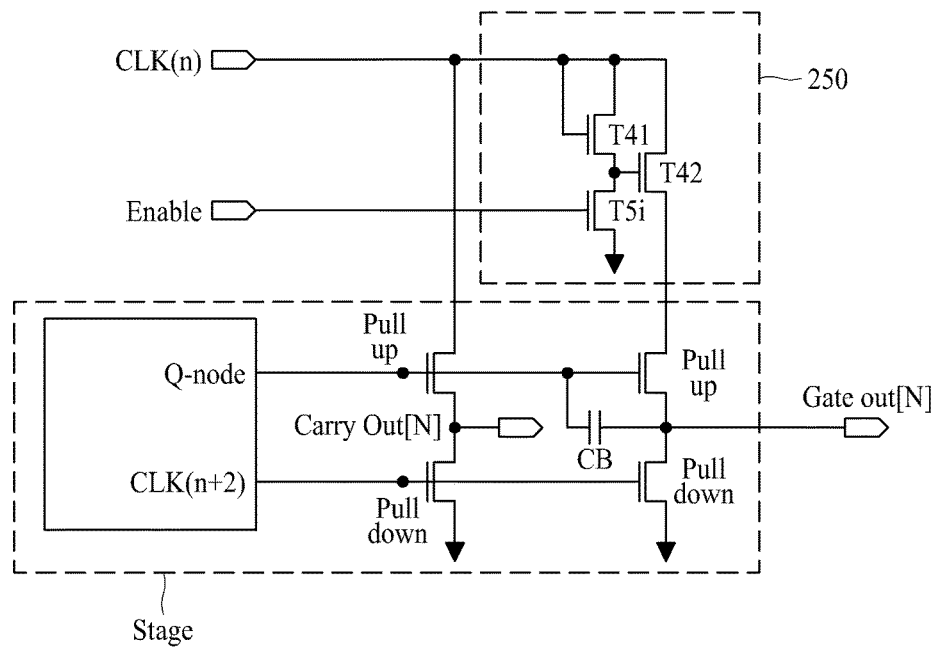
FIG. 6 is an exemplary diagram illustrating a gate driver having another structure applied to a display device of the present invention.
Figure 7:
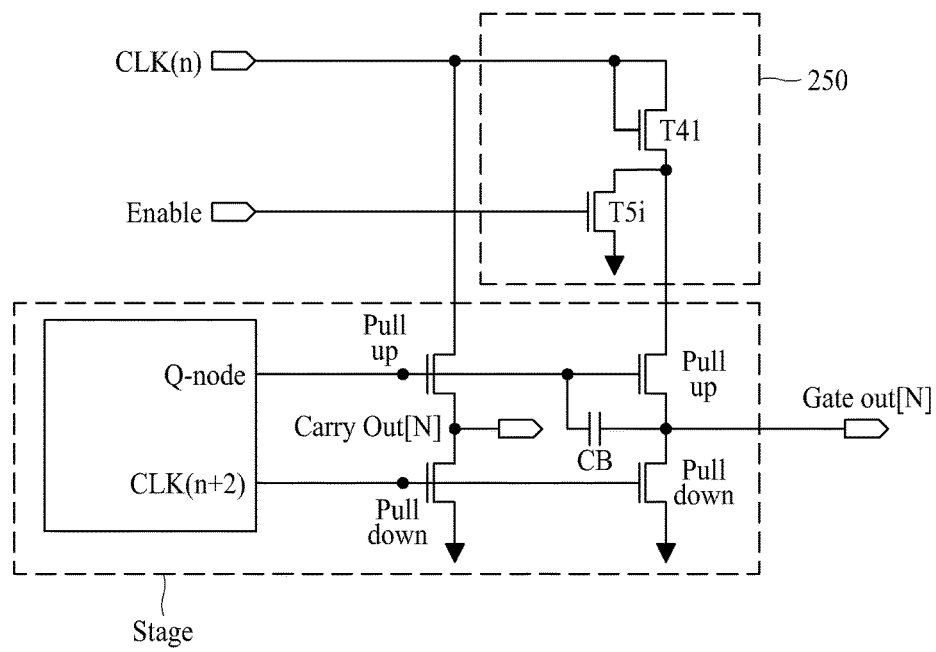
FIG. 7 is an exemplary diagram illustrating a gate driver having another structure applied to a display device of the present invention.
Figure 8:
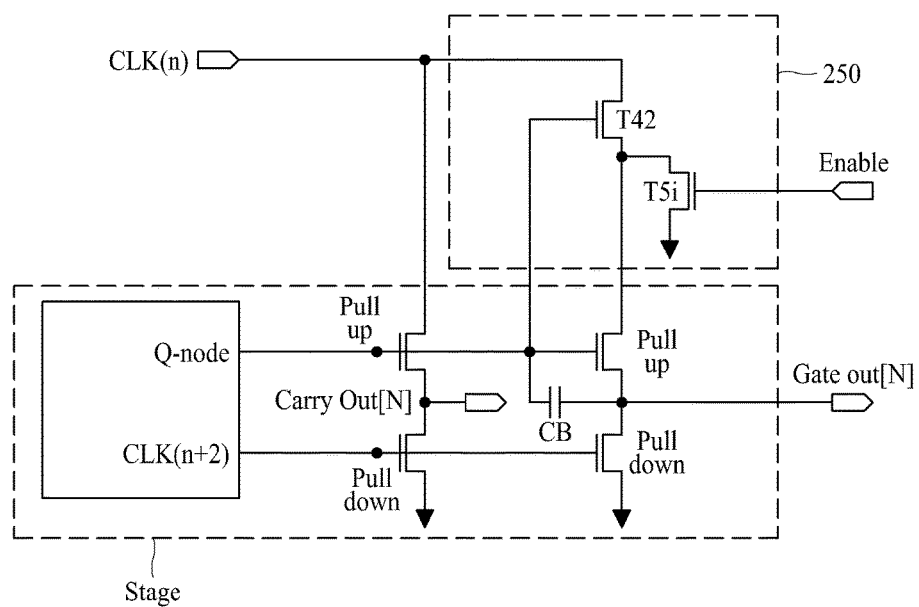
FIG. 8 is an exemplary diagram illustrating a gate driver having another structure applied to a display device of the present invention.
Figure 9:
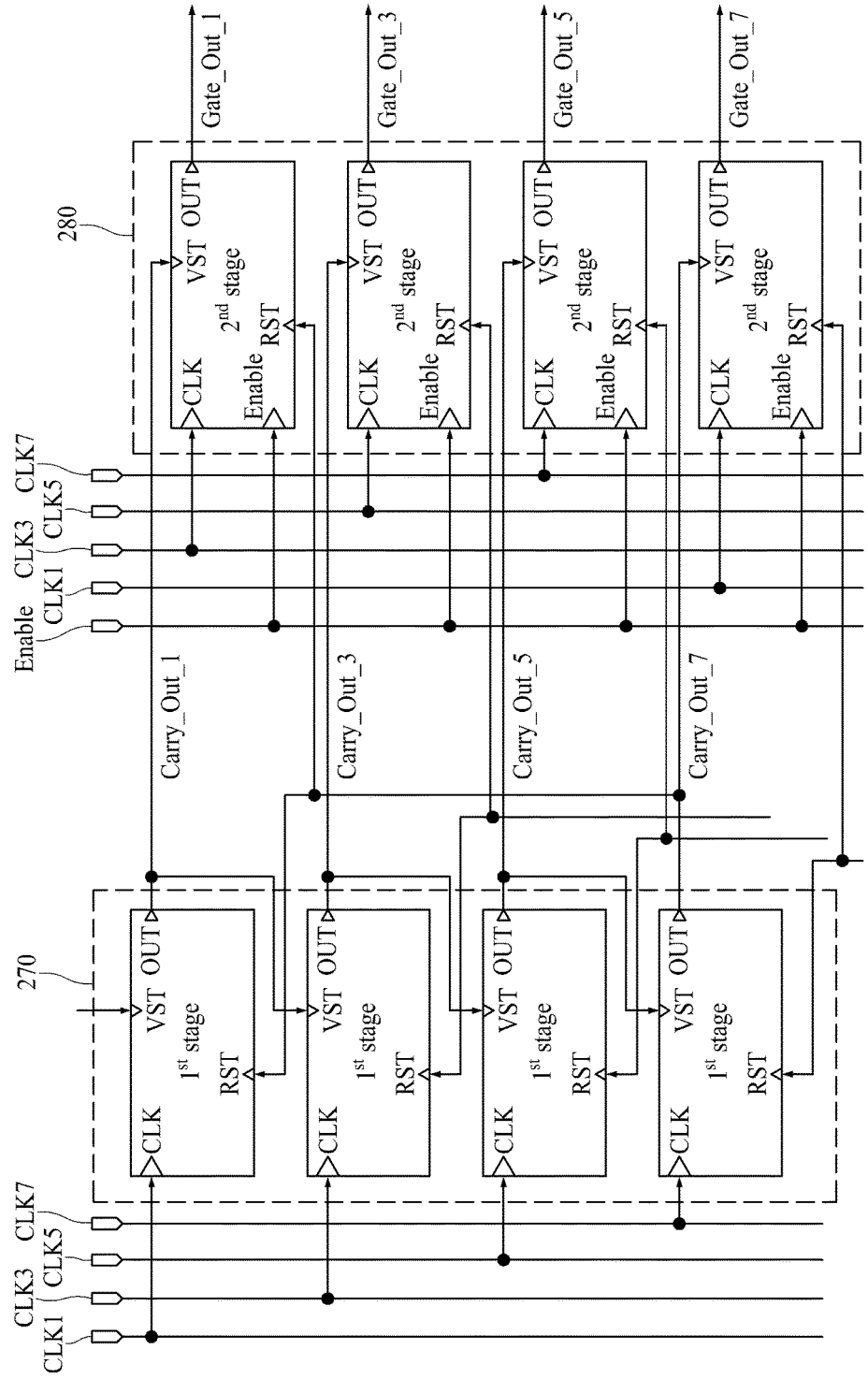
FIG. 9 is an exemplary diagram illustrating a gate driver having another structure applied to a display device of the present invention.
Figure 10:
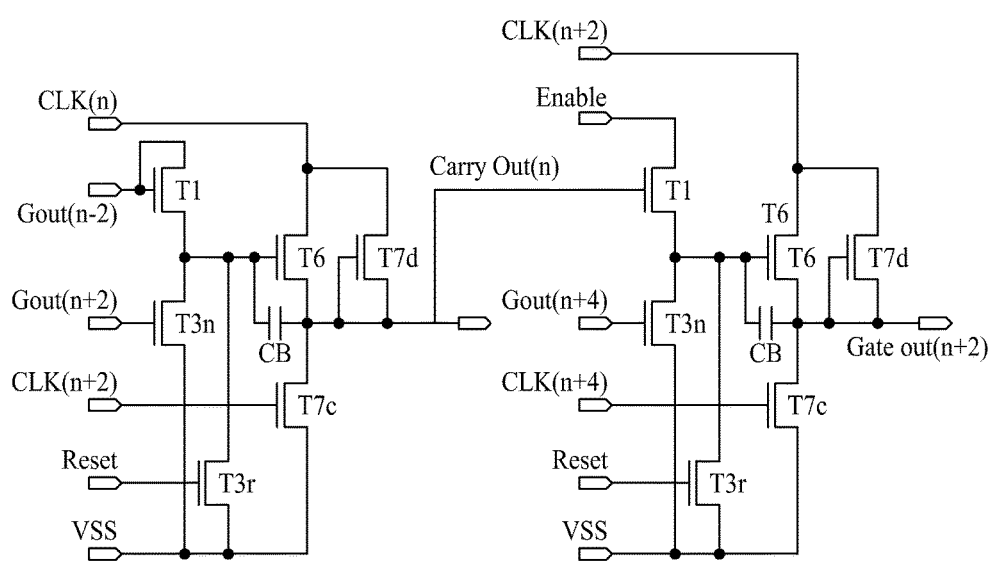
FIG. 10 is various configuration diagrams of a stage configuring a gate driver applied to a display device of the present invention.

FIG. 4 is an exemplary diagram illustrating an example of a gate driver which restricts an output of a scan signal to a gate line by using an enable signal, according to some embodiments of the present invention. FIG. 5 is an exemplary diagram showing waveforms of signals applied to a display device according to the present invention. FIG. 6 is an exemplary diagram illustrating a gate driver having another structure applied to a display device of the present invention. FIG. 7 is an exemplary diagram illustrating a gate driver having another structure applied to a display device of the present invention. FIG. 8 is an exemplary diagram illustrating a gate driver having another structure applied to a display device of the present invention. FIG. 9 is an exemplary diagram illustrating a gate driver having another structure applied to a display device of the present invention. FIG. 10 is various configuration diagrams of a stage configuring a gate driver applied to a display device of the present invention.

A gate driver 120 illustrated in FIG. 4 includes a shift register 260 configured with a plurality of stages that sequentially generate scan signals. A plurality of gate lines is connected to the stages of the shift register 260 and is supplied with the scan signals, respectively. The gate driver 120 includes a blocking unit 250 that discharges output terminals of the stages, connected to the gate lines, to a low-level VGL (or Ground) according to an enable signal applied through an enable signal line 212. In a first embodiment, the enable signal may discharge an output terminal of a stage, connected to a gate line, to a low-level voltage source VSS (Ground), and thus, an output of the scan signal supplied to the gate line may be controlled.

To provide an additional description, the blocking unit 250 includes a transistor T3 that is connected between the low-level voltage source VGL and the output of the stage connected to the gate line and includes a gate connected to the enable signal line 212. When the transistor T3 of the blocking unit 250 is turned on by the enable signal, the output terminal of the stage is discharged to the low-level voltage source VGL. Therefore, even when the stage outputs the scan signal to the output terminal, the scan signal is not applied to the gate line. A first stage generates the scan signal and outputs the scan signal to an output terminal of the first stage, and when the transistor T3 of the blocking unit 250 is turned off by the enable signal, the scan signal is output to the gate line. Subsequently, a second stage generates the scan signal and outputs the scan signal to an output terminal of the second stage, and when the transistor T3 of the blocking unit 250 is turned on by the enable signal, a voltage of the low-level voltage source VGL is output to the gate line without the scan signal being output to the gate line.

In FIG. 4, the blocking unit 250 that controls an output of the scan signal by using one enable signal is illustrated, but the number of enable signals is not limited. Therefore, in other embodiments, the blocking unit 250 may be driven by a plurality of enable signals supplied through a plurality of enable signal lines. When the blocking unit 250 operates according to the plurality of enable signals, a pre-charge time increases, and thus, characteristic of an output of a stage which again starts running can become better.

As shown in a timing diagram of FIG. 5, when a scan signal Gout3 of a first stage is output to an output terminal of the first stage and a scan signal Gout5 of a second stage is output to an output terminal of the second stage, an enable signal having a gate-off voltage is applied to the enable signal line 212. Therefore, the scan signals generated by the first and second stages are sequentially output to gate lines through the blocking unit 250. On the other hand, when a scan signal Gout7 of a fourth stage is output to an output terminal of the fourth stage and a scan signal Gout9 of a fifth stage is output to an output terminal of the fifth stage, an enable signal having a gate-on voltage is applied to the enable signal line 212. Therefore, gate lines connected to the fourth and fifth stages are discharged to the low-level voltage source VGL by the transistor T3 of the blocking unit 250. That is, in a period where the enable signal having the gate-off voltage is being applied, the transistor T3 of the blocking unit 250 is turned off, and thus, the scan signals generated from the stages are sequentially output to the gate lines. Accordingly, a driving area where pixels are charged with data voltages of data lines is generated.

However, in a period where the enable signal having the gate-on voltage is being applied, the transistor T3 of the blocking unit 250 is turned on, and thus, the scan signals generated from the stages are not output to the gate lines. Accordingly, a driving area where pixels are not charged with data voltages of data lines is generated. Even when the scan signals which are generated from the stages according to the enable signal are not output to the gate lines, a carry signal generated from a stage may be transmitted to a next stage to sequentially operate stages subsequent thereto.

For example, as shown in FIG. 5, even when scan signals which are generated from stages according to the enable signal are not output to gate lines, each of the stages of the shift register 260 may output a carry signal to drive a next stage. Therefore, when a scan signal generated from a stage is not output to the gate lines, the stages of the shift register 260 may be sequentially driven.

The carry signal may be supplied to a next stage through a carry signal terminal (Carry OUT) of each of the stages. Also, each stage may include a plurality of pull-up/pull-down transistors for outputting the scan signal, and moreover, may further include a plurality of pull-up/pull-down transistors for outputting the carry signal.

The gate driver 120 may include the blocking unit 250 that discharges a terminal, receiving a clock which is to be used as the scan signal in each stage, to the low-level voltage source according to the enable signal.

For example, as illustrated in FIG. 6, the blocking unit 250 includes a 42nd transistor T42 that is connected to a terminal receiving a clock CLK and the pull-up transistor of the stage, a 41st transistor T41 that is connected to the terminal receiving the clock CLK and a gate of the 42nd transistor T42 and is turned on/off by the clock CLK, and a 5ith transistor T5i that is connected to a terminal or a ground (hereinafter simply referred to as a low-level voltage source) receiving a low-level voltage and the gate of the 42nd transistor T42 and is turned on/off by the enable signal.

In a case where the pull-up transistor of the stage illustrated in FIG. 6 is turned on and the clock CLK has a high level, when the enable signal is deactivated, the 5ith transistor T5i is turned off, and the 41st transistor T41 and the 42nd transistor T42 are turned on, whereby the clock CLK is input to the pull-up transistor and is output to the gate line through the pull-up transistor. That is, the clock CLK is output as a scan signal to the gate line.

However, in a case where the pull-up transistor is turned on and the clock CLK has a high level, when the enable signal is activated, the 41st transistor T41 and the 5ith transistor T5i are turned on. Therefore, the clock CLK is discharged to the low-level voltage source through the 41st transistor T41 and the 5ith transistor T5i. Therefore, the clock CLK is not output to the gate line through the pull-up transistor. That is, the scan signal is not output to the gate line.

To provide an additional description, in a case where a blocking unit having a structure of FIG. 6 is provided, a method of controlling a clock supplied to a pull-up transistor of a stage to control an output of a scan signal is used instead of a method of discharging an output terminal of a stage to a low-level voltage source. First, in a basic normal driving operation, the enable signal is deactivated to turn off the T5ith transistor T5i, and a high-level clock transferred through the T41st transistor T41 turns on the 42nd transistor T42. When the 42nd transistor T42 is turned on, the clock is transferred to the pull-up transistor through the 42nd transistor T42, and thus, a normal scan signal is output to the gate line through the output terminal. In a stop operation, the enable signal turns on the T5ith transistor T5i to pull down the gate of the 42nd transistor T42 to a low level. Accordingly, the clock CLK is not output to the pull-up transistor through the 42nd transistor T42, and thus, the scan signal is not output to the gate line.

A basic structure of a gate driver 120 illustrated in FIG. 7 may be similar to the basic structure of the gate driver described above with reference to FIG. 6. That is, as illustrated in FIG. 7, one blocking unit 250 is individually connected to each stage that outputs one scan signal. However, a blocking unit 250 having a structure different from a structure according to the preceding embodiment is provided.

For example, as illustrated in FIG. 7, the blocking unit 250 includes a 41st transistor T41, which is connected to a terminal receiving a clock CLK and the pull-up transistor of the stage and is turned on/off by the clock CLK, and a 5ith transistor T5i that is connected to a low-level voltage source receiving a low-level voltage and the pull-up transistor of the stage and is turned on/off by the enable signal.

In a case where the pull-up transistor of the stage illustrated in FIG. 7 is turned on and the clock CLK has a high level, when the enable signal is deactivated, the 5ith transistor T5i is turned off, and the 41st transistor T41 is turned on, whereby the clock CLK is input to the pull-up transistor and is output to the gate line through the pull-up transistor. That is, the clock CLK is output as a scan signal to the gate line.

However, in a case where the pull-up transistor is turned on and the clock CLK has a high level, when the enable signal is activated, the 41st transistor T41 and the 5ith transistor T5i are turned on. Therefore, the clock CLK is discharged through the 41st transistor T41 and the 5ith transistor T5i. Therefore, the clock CLK is not output to the gate line through the pull-up transistor. That is, the scan signal is not output to the gate line.

To provide an additional description, the gate driver illustrated in FIG. 7 has a structure similar to a case where the 42nd transistor T42 is removed from the structure of FIG. 6 and the 41st transistor T41 is directly connected to the pull-up transistor. The gate driver illustrated in FIG. 7 shifts the clock, input through the 41st transistor T41, to a low level by using the enable signal like the gate driver of FIG. 6, for low-speed driving or divisional driving. Accordingly, the clock is not output to the gate line through the pull-up transistor.

A basic structure of a gate driver 120 illustrated in FIG. 8 includes a blocking unit 250 like the basic structure of the gate driver described above with reference to FIGS. 6 and 7. The blocking unit 250, as illustrated in FIG. 8, includes a 42nd transistor T42, which is connected to a terminal receiving a clock CLK and the pull-up transistor of the stage and includes a gate connected to a gate of the pull-up transistor, and a 5ith transistor T5i that is connected to a low-level voltage source receiving a low-level voltage and the pull-up transistor of the stage and is turned on/off by the enable signal.

In a case where the pull-up transistor of the stage illustrated in FIG. 8 is turned on and the clock CLK has a high level, when the enable signal is deactivated, the 5ith transistor T5i is turned off, and the 42nd transistor T42 is turned on, whereby the clock CLK is input to the pull-up transistor and is output to the gate line through the pull-up transistor. That is, the clock CLK is output as a scan signal to the gate line.

However, in a case where the pull-up transistor is turned on and the clock CLK has a high level, when the enable signal is activated, the 42nd transistor T42 may be turned on. Therefore, the clock CLK may be discharged to a low-level voltage source through the 42nd transistor T42 and the 5ith transistor T5i. Therefore, the clock CLK may not be output to the gate line through the pull-up transistor. That is, the scan signal may not be output to the gate line.

To provide an additional description, in the gate driver 120 illustrated in FIG. 8, the gate of the 42nd transistor T42 is connected to a Q-node of the stage. Therefore, in a normal screen driving operation, if a voltage of the Q-node is a high-level voltage, the clock having a high level is output to the gate line through the pull-up transistor (or TFT), and if the voltage of the Q-node is a low-level voltage, the 42nd transistor T42 is turned off, and thus, the clock is not output to the gate line. Also, in the gate driver 120 illustrated in FIG. 8, in a stop & start operation, the enable signal is shifted to a high level, and thus, the 5ith transistor T5i is turned on, whereby the clock passing through the 42nd transistor T42 is discharged to the low-level voltage source. Accordingly, the scan signal is not output to the gate line, and thus, an output of the scan signal to the gate line is restricted.

Moreover, the gate driver 120 may include a plurality of carry stages, which are sequentially driven to output a carry signal, and a plurality of scan stages which output the scan signal to the gate lines according to the enable signal.

In this case, as illustrated in FIG. 9, the gate driver 120 includes a first shift register 270, including a plurality of carry stages (1st stage) that sequentially generate carry signals Carry_Out_1 to Carry_Out_7, and a second shift register 280 including a plurality of scan stages (2nd stage) that sequentially output scan signals Gate_Out_1 to Gate_Out_7 to the gate lines according to the carry signals. At least one of the scan stages (2nd stage) included in the second shift register 280 blocks a scan signal output to the gate line according to the enable signal Enable.

For example, in FIG. 9, the carry stages (1st stage) provided on a left side configures the first shift register 270, and the scan stages (2nd stage) provided on a right side configures the second shift register 280.

The carry stages included in the first shift register 270 sequentially output the carry signals Carry_Out_1 to Carry_Out_7.

The carry signal is input as a start signal to the scan stage. The scan stage is driven by the carry signal and is finally output the scan signal to the gate line. The carry signal is input as the start signal to another carry stage included in the first shift register 270.

When the enable signal is input to the scan stage along with the carry signal, the scan stage may not output the scan signal to the gate line. That is, the scan stages configuring the second shift register 280 may be driven by the carry signal, but may not output the scan signal to the gate line according to the enable signal.

To provide an additional description with reference to FIG. 10, the enable signal may be supplied to a source of a T1 transistor used as a pre-charge TFT in each of the stages, and the carry signal may be supplied to a gate of the T1 transistor. In this case, when the T1 transistor is turned on by the carry signal and the enable signal is a low signal, a voltage of the Q-node connected to a gate of a pull-up transistor T6 becomes a low voltage. That is, when a low voltage is supplied according to the enable signal, the pull-up transistor T6 is turned off, and thus, the scan stage does not output the scan signal.

The display device according to some embodiments of the present invention may control an output of the scan signal to some gate lines in one frame period, based on the enable signal. For example, by adjusting a timing when the enable signal is applied and a period where the enable signal is applied in one frame period, the display area may be divided into a driving area including gate lines to which the scan signal is output and another driving area including other gate lines to which the scan signal is not output, and may be driven. In the present invention, a period where data voltages are charged into pixels in one driving area is adjusted to be shorter or longer than a period where data voltages are charged into pixels in another driving area, and thus, power consumption can be reduced in comparison with a conventional driving method where data voltages are charged into all pixels in the display area at constant period always.

By using the start signal and the enable signal in various methods in addition to the above-described structures, the panel may be driven by varying a period where the scan signal is output to the gate lines of the panel. For example, the panel may operate at a driving speed (for example, 60 FPS to 240 FPS) which is fundamentally set, and then may operate at a slower driving speed (for example, 1 FPS to 30 FPS) in response to a change in the driving speed of the panel or an output image. In the present invention, a period where data voltages are charged into pixels may vary according to the change in the driving speed of the panel or the output image, and thus, power consumption can be reduced in comparison with the conventional driving method where data voltages are charged into all pixels in the display area at constant period always.

Moreover, according to some embodiments of the present invention, like a touch sensing operation, operations which are easily performed in a state where the scan signal is not output to the gate line may be performed according to the start signal or the enable signal, based on a period where the scan signal is not output during one frame period. In the related art, in order to sense a touch in a period where there is no noise caused by the scan signal, the touch sensing operation is performed for a blank time between frames. On the other hand, in the present invention, due to the start signal or the enable signal, a period where the scan signal is not output may be generated a plurality of times in one frame period. In this case, since the touch sensing operation is performed a plurality of times during one frame period, a touch sensitivity can be enhanced. In addition to an operation of sensing a touch, operations which are easily performed in a state where the scan signal is not output to the gate line may be performed a plurality of times during one frame period.

Figure 11:
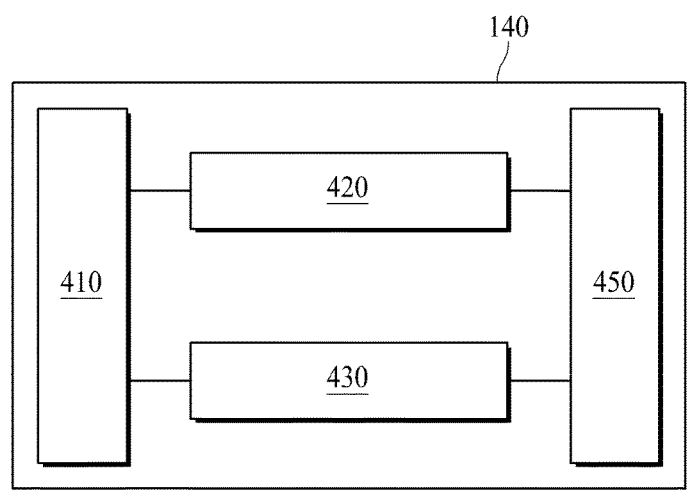
FIG. 11 is an exemplary diagram illustrating a configuration of a timing controller applied to a display device according to the present invention.
Figure 12:
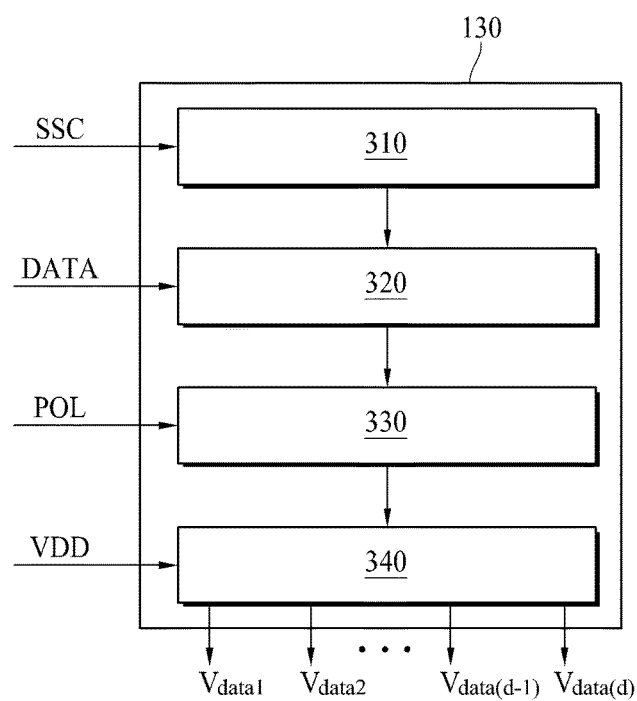
FIG. 12 is an exemplary diagram illustrating a configuration of a data driver applied to a display device according to the present invention.
Figure 13:
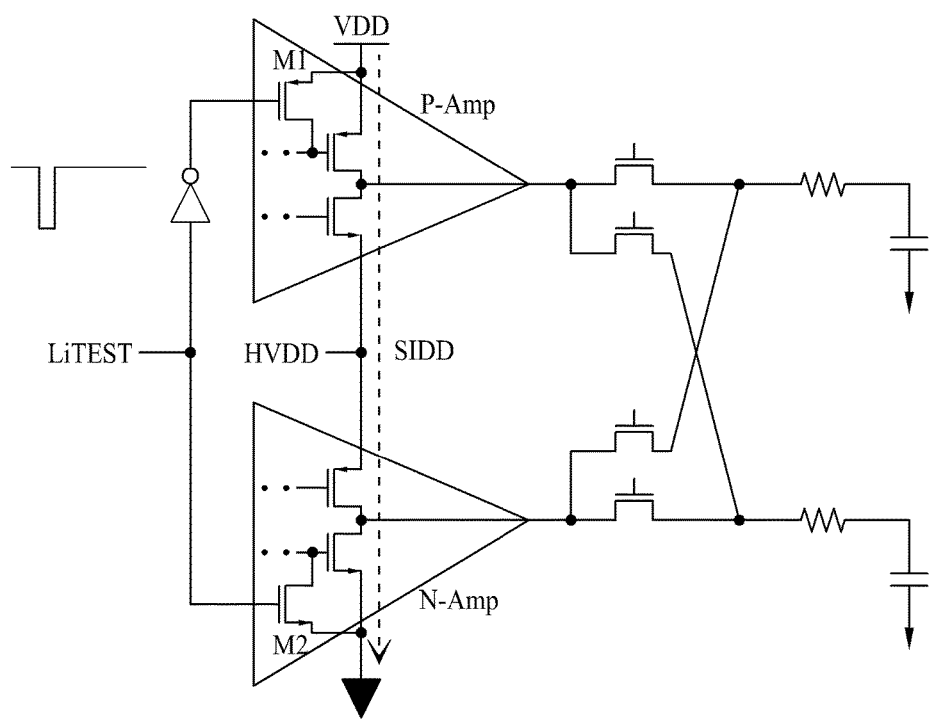
FIG. 13 is an exemplary diagram illustrating a configuration of an output buffer of a data driver applied to the display device according to an embodiment of the present invention.

FIG. 11 is an exemplary diagram illustrating a configuration of a timing controller applied to a display device according to the present invention. FIG. 12 is an exemplary diagram illustrating a configuration of a data driver applied to a display device according to the present invention. FIG. 13 is an exemplary diagram illustrating a configuration of an output buffer of a data driver applied to the display device according to the present invention.

The timing controller 140 generates a gate control signal GCS for controlling an operation timing of the gate driver 120 and a data control signal DCS for controlling an operation timing of the data driver 130 by using a plurality of timing signals (for example, a vertical synchronization signal Vsync, a horizontal synchronization signal Hsync, a data enable signal DE, etc.) input from an external system and generates image data which are to be transferred to the data driver 130.

To this end, as illustrated in FIG. 11, the timing controller 140 includes a receiver 410 for receiving input video data and the timing signals from the external system, a control signal generator 430 for generating various control signals, a data aligner 420 for realigning the input video data to generate image data, and an output unit 450 for outputting some of the control signals to the gate driver 120 and outputting the other control signals and the image data to the data driver 130.

That is, the timing controller 140 realigns the input video data received from the external system so as to match a structure and characteristic of the panel 110 and transfers the image data to the data driver 130. Such a function may be performed by the data aligner 420.

The timing controller 140 generates the gate control signal GCS for controlling the gate driver 120 and the data control signal DCS for controlling the data driver 130 by using the timing signals (for example, the vertical synchronization signal Vsync, the horizontal synchronization signal Hsync, the data enable signal DE, etc.) input from the external system and transfers the generated control signals to the data driver 130 and the gate driver 120. Such a function may be performed by the control signal generator 430.

The data control signals DCS generated by the control signal generator 430 includes a source start pulse SSP, a source shift clock signal SSC, a source output enable signal SOE, and a polarity inversion signal POL. The gate control signals GCS generated by the control signal generator 430 includes a gate start pulse GSP, a gate start signal VST, a gate shift clock GSC, a gate output enable signal GOE, and a gate clock GCLK.

Moreover, the control signal generator 430 may generate a power control signal for cutting off power supplied to the data driver 130.

The power control signal may be supplied to the data driver 130, and the data driver 130 may turn on a power source according to the power control signal. In this case, the data driver 130 may be configured so that an overall operation of the data driver 130 is be performed according to the power control signal, or only an operation of an output buffer that substantially outputs a data voltage to a data line is not performed according to the power control signal.

The power control signal may be transferred to a power supply driver that supplies power to the data driver 130. In this case, the power supply driver may cut off all power supplied to the data driver 300 according to the power control signal, or may cut off only power supplied to the output buffer that substantially outputs the data voltage to the data line.

As illustrated in FIG. 12, the data driver 130 converts digital image data, transferred from the timing controller 140, into analog data voltages and supplies the analog data voltages for one horizontal line to the data lines at every one horizontal period where a gate-on signal VGH is supplied to the gate line.

The data driver 130 and the timing controller 140 may be provided as one IC.

The data driver 130 may be connected to the panel 110 in a COF type. In this case, the data driver 130 may be directly mounted on the panel 110, or may be directly provided on the panel 110. The number of the data drivers 130 may be variously set based on a size, a resolution, and/or the like of the panel 110.

The data driver 130 converts the image data into the data voltages by using gamma voltages supplied from a gamma voltage generator, and supplies the data voltages to the data lines. To this end, the data driver 130 includes a shift register 310, a latch 320, a digital-to-analog converter (DAC) 330, and an output buffer 340.

The shift register 310 outputs a sampling signal by using the data control signals (SSC, SSP, etc.) received from the timing controller 140.

The latch 320 latches the digital image data which are sequentially received from the timing controller 140, and then, simultaneously outputs the latched image data to the DAC 330.

The DAC 330 converts the image data, transferred from the latch 320, into the data voltages Vdata and outputs the data voltages. That is, the DAC 330 converts the image data into the data voltages by using the gamma voltages supplied from the gamma voltage generator, and outputs the data voltages to the data lines.

Moreover, the DAC 330 may invert polarities of the data voltages by using the polarity inversion signal POL at every frame.

The output buffer 340 outputs the data voltages, transferred from the DAC 330, to the data lines DL of the panel 110 according to the source output enable signal SOE transferred from the timing controller 140.

As described above, power supplied to the data driver 130 may be cut off by the power control signal during a data voltage non-output period where a data voltage is not output in one frame period.

In this case, all power supplied to the data driver 130 may be cut off, or power supplied to one element selected from the shift register 310, the latch 320, the DAC 330, and the output buffer 340 may be cut off.

Particularly, a case where power VDD supplied to the output buffer 340 is cut off is illustrated in FIG. 13. That is, FIG. 13 is an exemplary diagram illustrating a configuration of the output buffer 340 of the data driver 130, and illustrates an internal configuration of the output buffer 340 where power is cut off according to the power control signal.

To provide an additional description, the output buffer 340 may output the data voltages to the data lines by using a driving voltage VDD during a data voltage output period in one frame period and may block the supply of the driving voltage VDD during the data voltage non-output period in the one frame period.

Since the supply of the driving voltage VDD to the output buffer 340 is blocked, data voltages are not output to the data lines during the data voltage non-output period, and consumption power of the data driver 130 can be reduced.

The output buffer 340 for performing the above-described function may be provided in various circuit structures in addition to a circuit structure of FIG. 13.

To provide an additional description, according to some embodiments of the present invention, static power can be minimized by using a concept where a bias voltage VDD of the data driver 130 is cut off by a switch.

The power control signal may be supplied to the output buffer 340 of the data driver 130 in synchronization with a period where an output of the scan signal from the gate driver 120 is restricted by the start signal or the enable signal.

Figure 14:
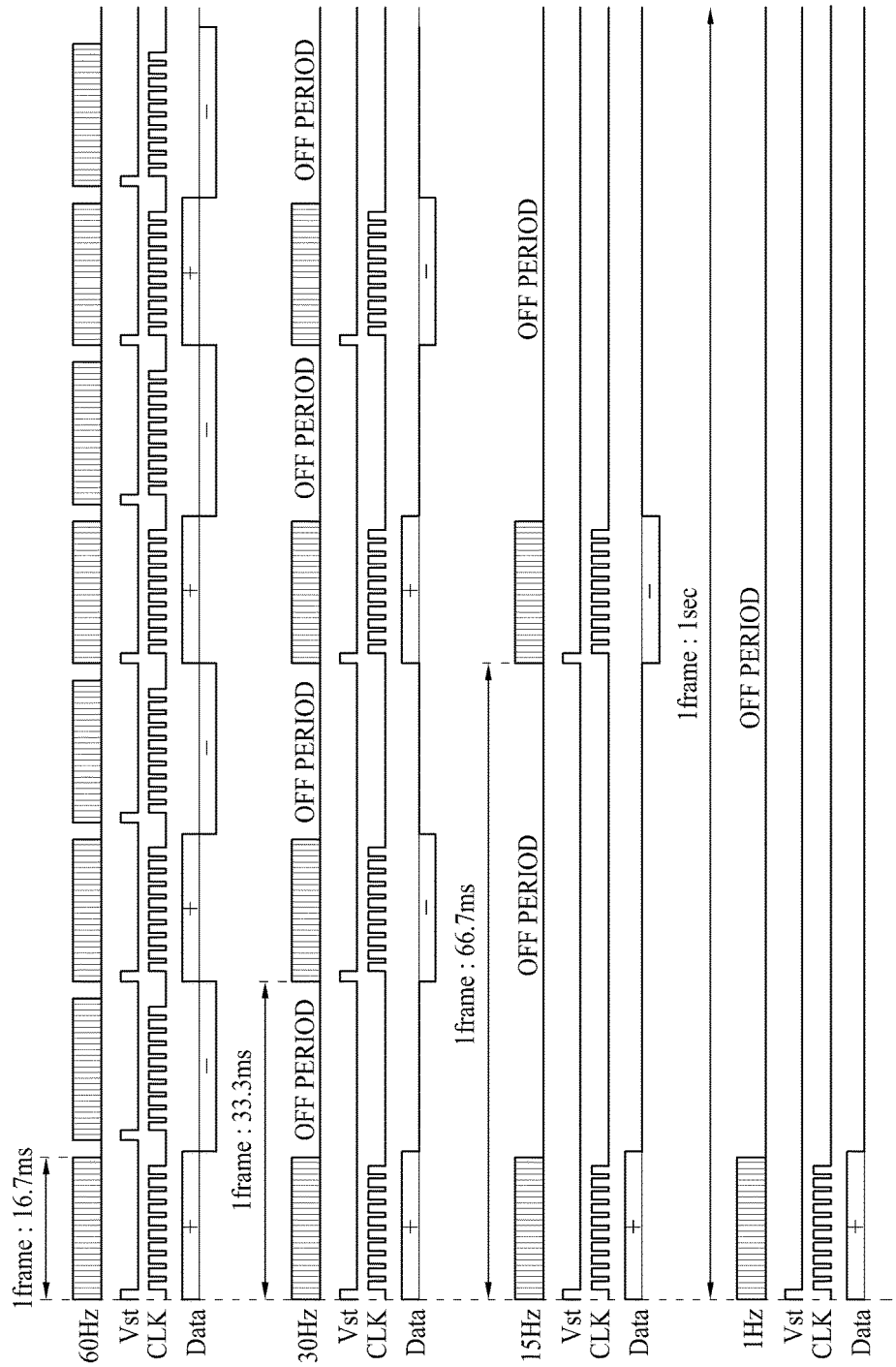
FIGS. 14 and 15 are exemplary diagrams showing polarities of data voltages applied for varying a period, where all pixels in a display area are recharged with the data voltages, by restricting an output of a scan signal from the gate driver according to a start signal or an enable signal.
Figure 15:
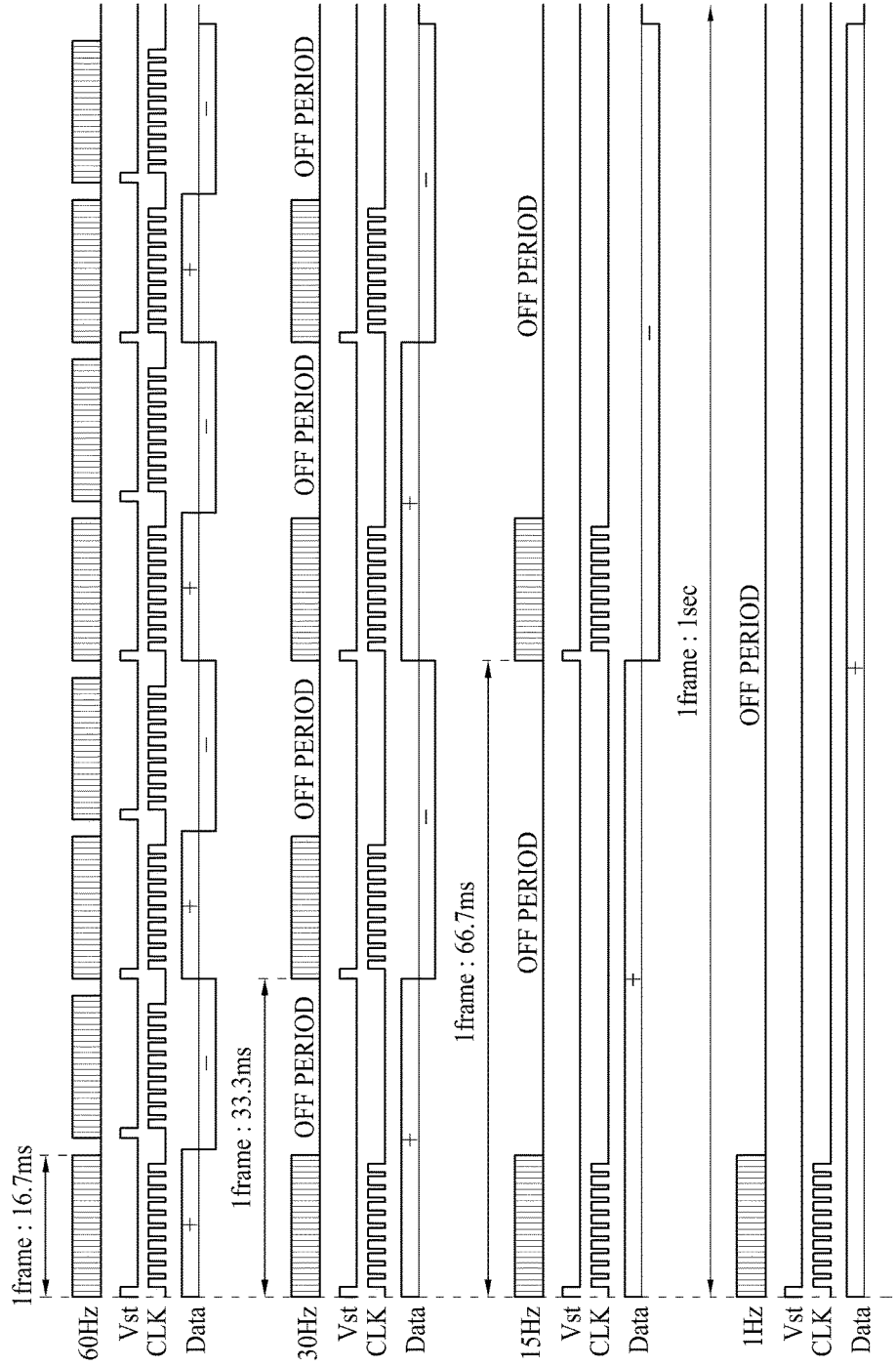

FIGS. 14 and 15 are exemplary diagrams showing polarities of data voltages applied for varying a period, where all pixels in a display area are recharged with the data voltages, by restricting an output of a scan signal from the gate driver according to a start signal or an enable signal. For convenience of description, FIGS. 14 and 15 show a polarity of a data voltage when the panel driven at 60 Hz is driven at 30 Hz, 15 Hz, and 1 Hz which are lower than 60 Hz.

Referring to FIG. 14, in some embodiments of the present invention, the data driver 130 has a feature where when the panel 110 is driven according to a plurality of frequencies, the data driver 130 inverts a polarity of a data voltage to output the polarity-inverted data voltage to a data line at every frame, and power is cut off during a data voltage non-output period where the data voltage is not output in one frame period. As described above, in a case where the display device is driven at a low frequency of 30 Hz, one frame period may be 33.3 ms. In this case, the data voltage may be output to the data line during only a data voltage output period corresponding to 16.7 ms, and during the other period (i.e., the other data voltage non-output period (an OFF period) corresponding to 16.7 ms) of one frame period, the data voltage may not be output.

In this case, by using the power control signal, the timing controller 140 may control the supply of power to the data driver 130 or may control the supply of power to some elements of the data driver 130.

That is, polarities of data voltages may be inverted at every frame, and driving of the data driver 130 is stopped during the data voltage non-output period (the OFF period) where the data voltages are not output in one frame period, or the supply of power to at least one element of the data driver 130 is blocked. Therefore, as shown in FIG. 14, the polarities of the data voltages is not shown in the data voltage non-output period (the OFF period).

To provide an additional description, in a case where the display device is driven by varying a frequency, when data voltages having the same polarity are output to data lines at every frame, one-sided polarity is accumulated, and thus, flicker does not occur. However, defects such as image sticking and smears occur due to accumulation of DC voltages. Therefore, in a case where a driving speed of the panel varies and thus the panel is driven at a second FPS (for example, 30 FPS) slower than a first FPS (for example, 60 FPS), polarities of data voltages are inverted whenever a frame changes, in order for data voltages having the same polarity not to be applied in the data voltage output period. Also, in each frame, driving of at least some elements of the data driver 130 is not performed in the data voltage non-output period (the OFF period) where data voltages are not output.

The method of driving the display device described above with reference to FIG. 14 includes, when the panel is driven at the first FPS and the second FPS slower than the first FPS, outputting a data voltage to a data line during a data voltage output period in one frame period, blocking the supply of power to the data driver generating the data voltage during a data voltage non-output period (an OFF period) where the data voltage is not output in the one frame period, and when another one frame period starts, inverting a polarity of the data voltage to output the polarity-inverted data voltage during the data voltage output period, and blocking the supply of power to the data driver during the data voltage non-output period (the OFF period).

In this case, since driving of the data driver 130 is stopped for a certain time, or the supply of power to the output buffer 340 of the data driver 130 is blocked, consumption power of the data driver 130 can be reduced.

Moreover, since the polarity of the data voltage is inverted at every frame, as shown in FIG. 14, data voltages having different polarities are output to data lines in a data voltage output period of each frame. Therefore, defects such as image sticking and smears caused by accumulation of DC voltages do not occur.

As shown in FIG. 14, with the same principle as that of a display device which is driven at 30 Hz through frequency variation, in a display device driven at a low frequency such as 15 Hz or 1 Hz, consumption power of the data driver 130 is reduced, and defects such as image sticking and smears caused by accumulation of DC voltages can be prevented from occurring.

Referring to FIG. 15, as described above, the display device according to some embodiments of the present invention includes the panel 110, the gate driver 120, the data driver 130, and the timing controller 140.

Particularly, when the panel is driven at the first FPS and then is driven at the second FPS slower than the first FPS through variation, the data driver 130 according to some embodiments of the present invention inverts a polarity of a data voltage to output the polarity-inverted data voltage to a data line at every frame.

That is, in a second embodiment of the present invention, the polarity of the data voltage is inverted at every frame.

To provide an additional description, in a case of using a column inversion method, the display device according to the second embodiment of the present invention inverts the polarity of the data voltage whenever a frame changes, and particularly, as shown in FIG. 15, a period where the polarity of the data voltage is inverted increases.

That is, the data driver 130 drives the DAC 330 of the data driver 130 by using only one polarity during both a data voltage output period and a data voltage non-output period in one frame period. Therefore, an inversion of a polarity can be minimized, and thus, consumption power of the data driver 130 can be reduced.

The method of driving the display device described above with reference to FIG. 15 includes, when the panel is driven at the first FPS and the second FPS slower than the first FPS, outputting a data voltage to a data line during a data voltage output period in one frame period, performing an operation, where the data voltage is not output, during a data voltage non-output period in the one frame period, and when another one frame period arrives, inverting a polarity of the data voltage to output the polarity-inverted data voltage.

When the display device is driven at a low frequency of 30 Hz, as shown in FIG. 14, one frame period is 33.3 ms. In this case, the data voltage is output to the data line during only a data voltage output period corresponding to 16.7 ms, and the data voltage is not output during the other period (i,e., the data voltage non-output period (the OFF period)) of the one frame period.

In this case, the data driver 130 drives the DAC 330 by using only one polarity during both the data voltage output period and the data voltage non-output period. Therefore, an inversion of a polarity can be minimized, and thus, consumption power of the data driver 130 can be reduced.

Moreover, since the polarity of the data voltage is inverted at every frame, as shown in FIG. 15, data voltages having different polarities are output to data lines at every frame. Therefore, defects such as image sticking and smears caused by accumulation of DC voltages do not occur.

As shown in FIG. 15, with the same principle as that of a display device which is driven at 30 Hz through frequency variation, in a display device driven at a low frequency such as 15 Hz or 1 Hz, consumption power of the data driver 130 is reduced, and defects such as image sticking and smears caused by accumulation of DC voltages can be prevented from occurring.

The display device and the driving method thereof described above with reference to FIGS. 14 and 15 are not limited to a case where the display device is driven at frequencies such as 60 Hz, 30 Hz, 15 Hz, and 1 Hz, and the present invention may be applied to display devices which are driven at a predetermined frequency and one or more frequencies lower than the predetermined frequency through variation. Also, the present invention may be applied to a case where a display device is driven in a column inversion method, a dot inversion method, or a frame inversion method.

Figure 16A:
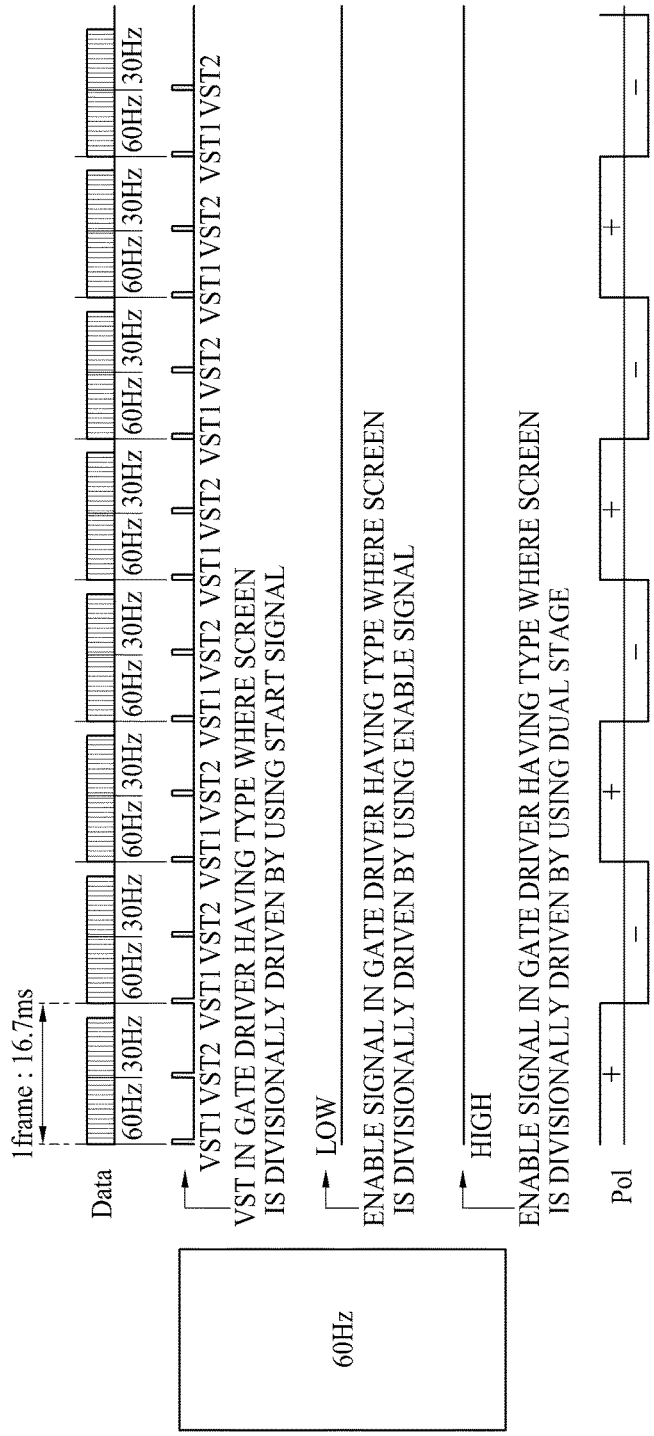
FIGS. 16A to 16D are exemplary diagrams showing polarities of data voltages applied for dividing a display area into a plurality of driving areas and driving the plurality of driving areas by restricting the output of the scan signal from the gate driver according to the start signal or the enable signal.
Figure 16B:
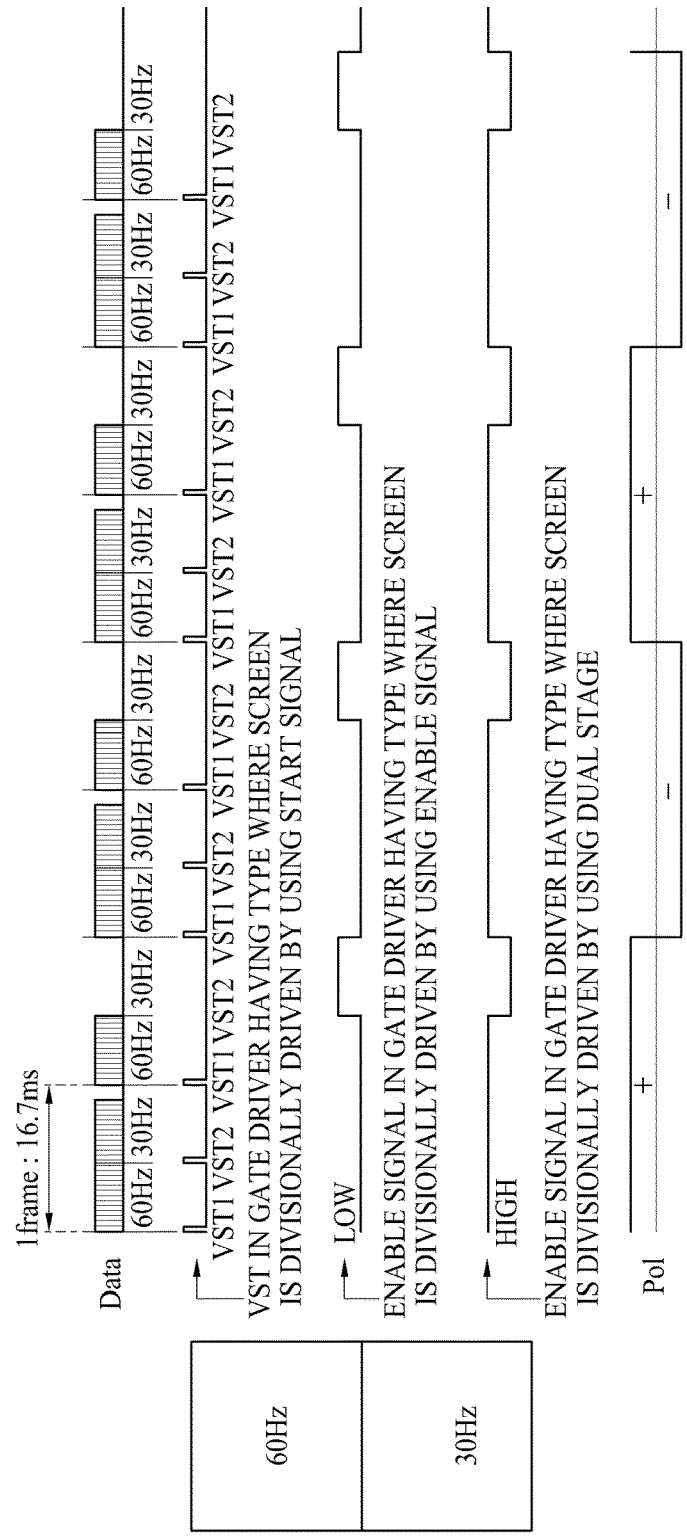
Figure 16C:
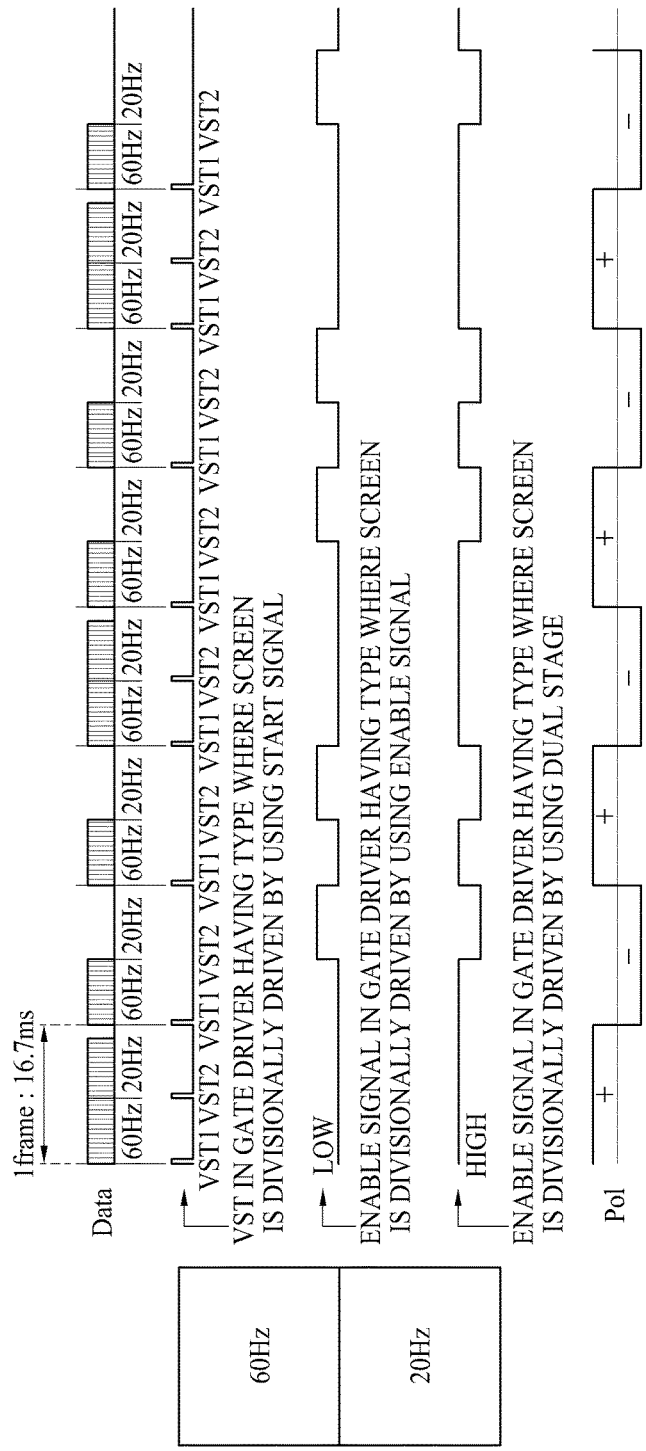

FIGS. 16A to 16D are exemplary diagrams showing polarities of data voltages applied for dividing a display area into a plurality of driving areas and driving the plurality of driving areas by restricting the output of the scan signal from the gate driver according to the start signal or the enable signal. For convenience of description, FIG. 16A is an exemplary diagram showing driving of the gate driver and the data driver when a whole display area is driven at 60 Hz. FIGS. 16B to 16C are exemplary diagrams showing driving of the gate driver and the data driver when a portion of the display area is driven at 60 Hz and the other portion is driven at 30 Hz, 20 Hz, and 15 Hz.

First, as shown in FIG. 16A, when the whole display area is driven at the same frequency, data voltages are sequentially supplied to data lines in one frame period. That is, data voltages are continuously supplied except for a blank time between two frames. In other words, the one frame period is not divided into a data voltage output period and a data voltage non-output period.

In the above-described structures of the gate driver 120, if the gate driver 120 is configured with a plurality of stage groups which are driven by independent external start signals supplied from the outside, the external start signals for starting driving of the respective stage groups are applied so that the scan signal is output to the gate lines according to a timing when a data voltage is applied to a corresponding data line. An example where the gate driver 120 is configured with two stage groups is illustrated in FIG. 16A. Therefore, in each frame, an external start signal VST1 for starting driving of a first stage group is applied, and then, an external start signal VST2 for starting driving of a second stage group is applied. That is, a second external start signal VST2 is applied so that the scan signal is sequentially output at certain intervals from stages included in two stage groups.

In the above-described structures of the gate driver 120, if the gate driver 120 includes a blocking unit that discharges an output terminal of a stage or an input terminal for a clock used as the scan signal to a low-level voltage source by using the enable signal, the enable signal is not applied during a corresponding period in order for the whole display area to be driven at the same frequency. In other words, the enable signal corresponding to a low voltage is supplied. Therefore, a period at which the scan signal is applied from the stages of the gate driver 120 to the gate lines does not change.

In the above-described structures of the gate driver 120, if the gate driver 120 is configured in a dual shift register structure which includes a plurality of carry stages and a plurality of scan stages, the scan signal are output only when the enable signal is applied, and an output of the scan signal is restricted in a period where the enable signal is not applied. Therefore, in the dual shift register structure, the enable signal is applied during a corresponding period, for driving the whole display area at the same frequency. In other words, the enable signal corresponding to a high voltage is supplied.

In a case where data voltages are recharged into pixels in the whole display area according to the same frequency through the above-described operations, the data driver supplies data voltages having an inverted polarity at every frame.

FIG. 16B is an exemplary diagram for describing an example where the display area is divided into an area driven at 60 Hz and an area driven at 30 Hz and driven. That is, a first driving area of the display area is driven at 60 FPS, and a second driving area is driven at 30 FPS. First, if the gate driver 120 is configured with a plurality of stage groups which are respectively driven by independent external start signals applied thereto, during a first frame period, an external start signal VST1 applied to a first stage group corresponding to the first driving area and an external start signal VST2 applied to a second stage group corresponding to the second driving area are all supplied, and thus, pixels in the whole display area are charged with data voltages. However, during a second frame period, the external start signal VST1 for starting the first stage group is applied, but the external start signal VST2 for starting the second stage group is not applied. Therefore, during the second frame period, the scan signal is output to the first driving area but is not output to the second driving area. During a third frame period, like the first frame period, the external start signal VST1 applied to the first stage group corresponding to the first driving area and the external start signal VST2 applied to the second stage group corresponding to the second driving area are all supplied. Through such driving, the panel may be divided into the first driving area including pixels which are recharged sixty times for one second and the second driving area including other pixels which are recharged thirty times for one second, and may be driven.

In the above-described structures of the gate driver 120, if the gate driver 120 includes a blocking unit that discharges an output terminal of a stage or an input terminal for a clock used as the scan signal to a low-level voltage source by using the enable signal, the enable signal is not applied in the first frame period. Therefore, the pixels in the whole display area are charged with the data voltages. On the other hand, in the second frame period, when stages corresponding to the second driving area are driven, the enable signal is applied. Accordingly, the scan signal is not output to gate lines connected to the stages corresponding to the second driving area. During the third frame period, like the first frame period, the pixels in the whole display area are charged with the data voltages without the enable signal being applied. Through such driving, the panel may be divided into the first driving area including the pixels which are recharged sixty times for one second and the second driving area including the other pixels which are recharged thirty times for one second, and may be driven.

In the above-described structures of the gate driver 120, if the gate driver 120 is configured in a dual shift register structure which includes a plurality of carry stages and a plurality of scan stages, the scan signal is output only when the enable signal is applied, and an output of the scan signal is restricted in a period where the enable signal is not applied. Therefore, during the first frame period, the enable signal is applied, and thus, the pixels in the whole display area are charged with the data voltages. On the other hand, in the second frame period, the enable signal is applied while carry stages/scan stages corresponding to the first driving area are being driven, but while carry stages corresponding to the second driving area are being driven, the enable signal is not applied. Accordingly, the scan signal is not output to gate lines respectively connected to the stages corresponding to the second driving area. Accordingly, even when a transistor for starting driving of each of the scan stages is turned on by a carry signal transferred from each of the carry stages, the enable signal corresponding to a low voltage is supplied, and thus, pixels in the second driving area are not recharged with data voltages. During the third frame period, like the first frame period, the enable signal is not applied while carry stages/scan stages corresponding to the whole display area are being driven. Through such driving, the panel may be divided into the first driving area including the pixels which are recharged sixty times for one second and the second driving area including the other pixels which are recharged thirty times for one second, and may be driven.

A frame period, where an output of the scan signal to a partial area is restricted by the start signal or the enable signal, may include a data voltage output period where a data voltage is output and a data voltage non-output period. As described above, during the data voltage non-output period, the supply of power to the data driver 130 or some elements of the data driver 130 may be controlled. For example, since the supply of power to the data driver 130 is controlled during the data voltage non-output period, driving of the data driver 130 may be stopped, or power supplied to the output buffer 340 of the data driver 130 may be cut off during the data voltage non-output period.

If the gate driver 120 and the data driver 130 are driven in the above-described method, a period where a polarity of a data voltage is inverted may vary so that a driving area alternately driven by the start signal or the enable signal is not always charged with a data voltage having the same polarity. That is, the data driver 130 may be set so that a data voltage having a polarity opposite to that of a previously supplied data voltage is supplied to a driving area where recharging of pixels is delayed by the start signal or the enable signal.

FIG. 16C is an exemplary diagram for describing an example where the display area is divided into an area driven at 60 Hz and an area driven at 20 Hz and driven. That is, a first driving area of the display area is driven at 60 FPS, and a second driving area is driven at 20 FPS. Even in this case, the gate driver 120 is driven in a method similar to the method described above with reference to FIG. 16B. That is, pixels in the whole display area are charged with data voltages in a first frame period, but in a second frame period and a third frame period, pixels in the second driving area may not be charged with data voltages. Also, the pixels in the whole display area are recharged with data voltages in a fourth frame period.

Frame periods, where an output of the scan signal to a partial area is restricted by the start signal or the enable signal, may include a data voltage output period where a data voltage is output and a data voltage non-output period. During the data voltage non-output period, the supply of power to the data driver 130 or some elements of the data driver 130 may be controlled. Also, the data driver 130 may be set so that a data voltage having a polarity opposite to that of a previously supplied data voltage is supplied to a driving area where recharging of pixels is delayed by the start signal or the enable signal.

Figure 16D:
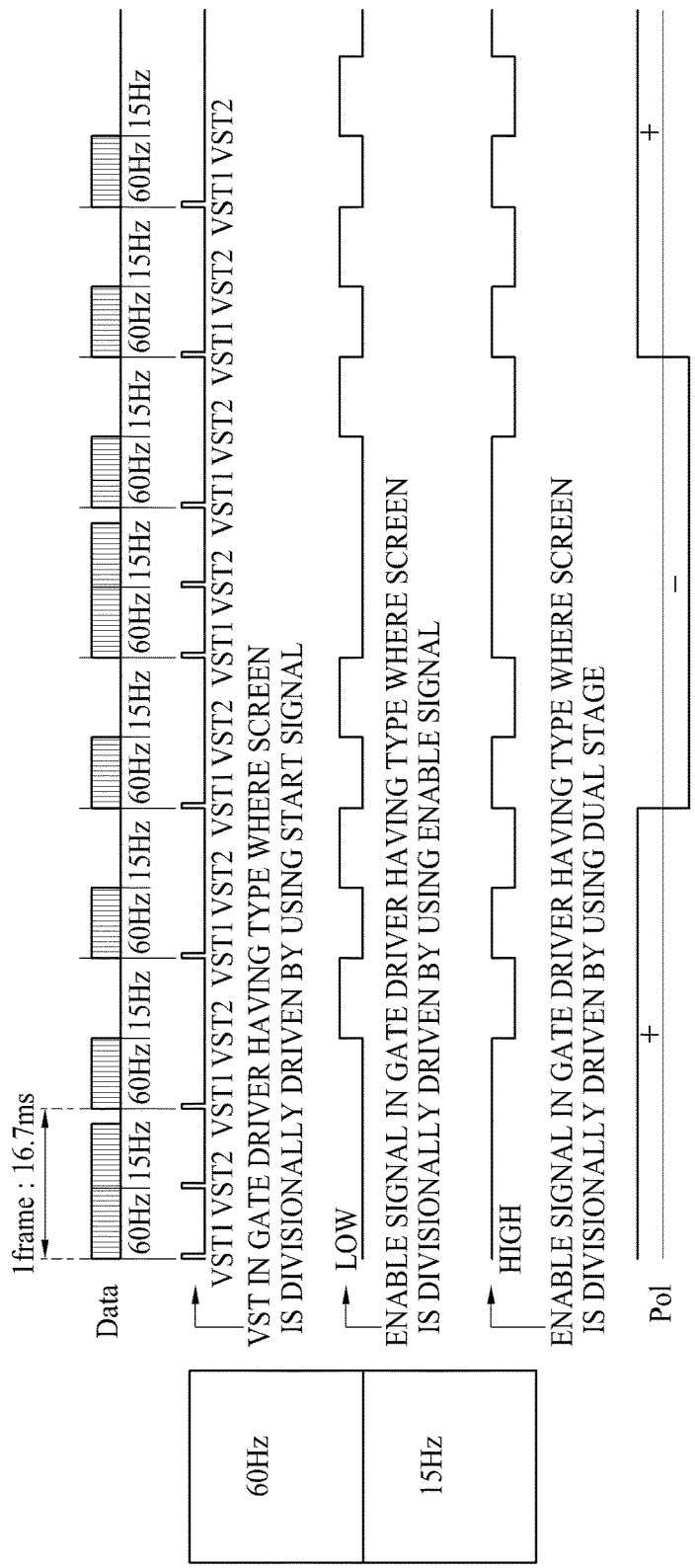

FIG. 16D is an exemplary diagram for describing an example where the display area is divided into an area driven at 60 Hz and an area driven at 15 Hz and driven. That is, a first driving area of the display area may be driven at 60 FPS, and a second driving area may be driven at 15 FPS. Even in this case, the gate driver 120 and the data driver 130 may be driven in a method similar to the method described above with reference to FIGS. 16B and 16C.

TFTs configuring the gate driver 120 applied to the embodiments described herein may each be implemented as an oxide TFT, for example, indium gallium zinc oxide (IGZO). However, the present invention is not limited thereto. In other embodiments, a TFT applied to the embodiments of the present invention may be configured as an amorphous silicon (a-Si) TFT, or may be configured as a poly TFT through a low temperature poly silicon (LTPS) process.

Particularly, the oxide TFT is better in mobility characteristic of a current than the a-Si TFT, and thus, when the oxide TFT is applied, a size of a circuit can be reduced.

Moreover, a leakage current of the oxide TFT is lower than that of each of the a-Si TFT and an LTPS TFT. Therefore, as in the display device according to embodiments of the present invention or a gate driver that allows one driving area of the display area 100 to be driven at a frame rate lower than that of another driving area, if the oxide TFT is applied to a gate driver that does not output a scan signal temporarily, the gate driver can be more stably driven.

However, as described above, according to embodiments of the present invention, in addition to the oxide TFT, the a-Si TFT or the LTPS TFT may be applied, and moreover, the a-Si TFT, the LTPS TFT, and the oxide TFT may be used together.

Figure 17:
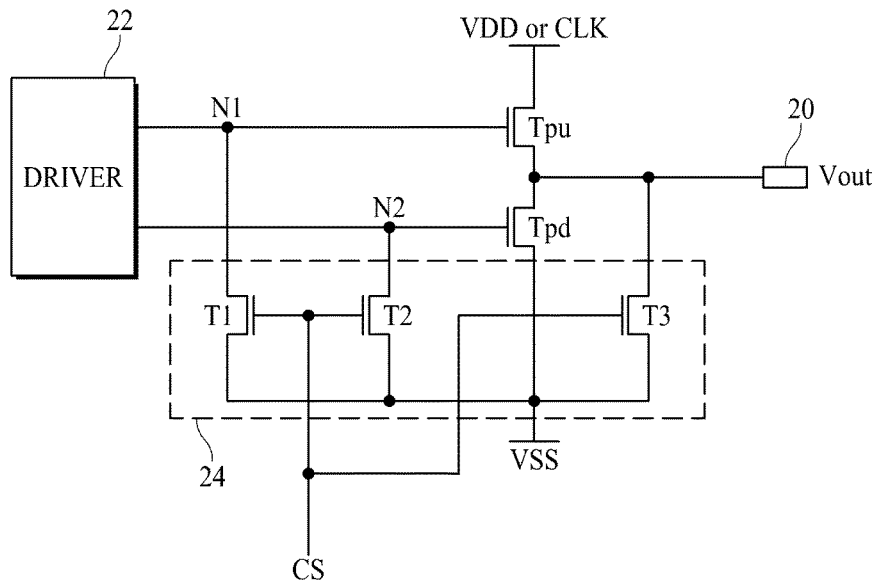
FIG. 17 is an exemplary diagram illustrating a configuration of a stage applied to the display device according to an embodiment of the present invention.
Figure 18:
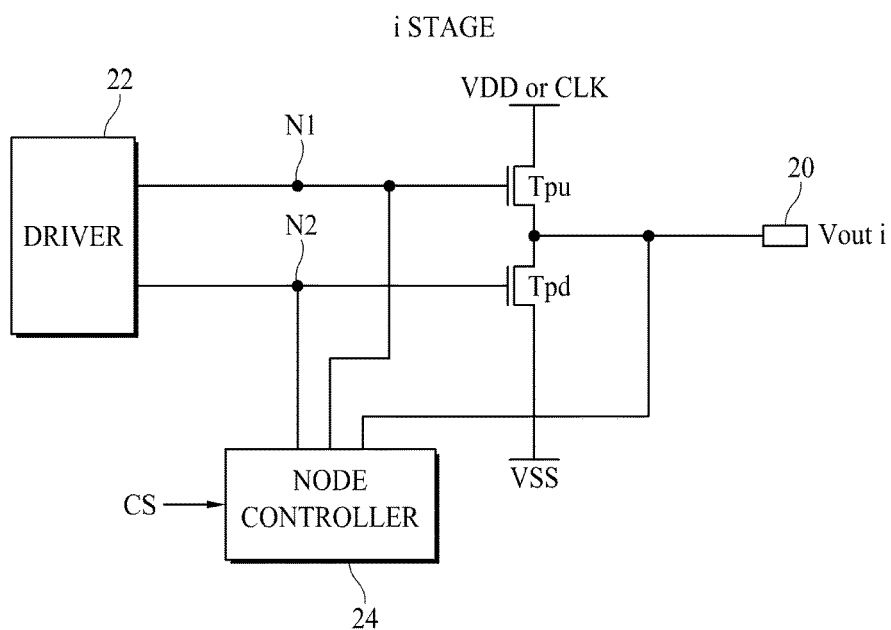
FIG. 18 is an exemplary diagram illustrating a configuration of a node controller illustrated in FIG. 17.

FIG. 17 is an exemplary diagram illustrating a configuration of a stage applied to the display device according to an embodiment of the present invention, and FIG. 18 is an exemplary diagram illustrating a configuration of a node controller illustrated in FIG. 17.

The gate driver 120 includes a plurality of stages which sequentially output a scan pulse, and each of the stages may be configured with a plurality of TFTs. Each of the stages should stably maintain a voltage of a gate line connected thereto. However, while the gate driver 120 is being driven, some nodes included in each stage may be in a floating state and can be affected by external noise, causing abnormal driving where a voltage of a corresponding gate line changes, and/or the like.

Moreover, a lifetime of each of the TFTs included in each stage is shortened due to a stress caused by residual electric charges remaining in nodes which is in the floating state. Particularly, in TFTs which use an oxide semiconductor, since an off current is very low, a very long time is taken until the residual electric charges are naturally discharged. For this reason, a time for which the stress caused by the residual electric charges is applied to a TFT using an oxide semiconductor increases.

Therefore, according to embodiments of the present invention, as illustrated in FIGS. 17 and 18, a node controller 24 may be added into each stage, and the node controller 24 controls a floating node to a specific stage and minimizes residual electric charges. Therefore, the gate driver 120 is more stably driven, and the lifetime and reliability of each of the transistors configuring the gate driver 120 increase.

According to the present invention, the gate driver 120 controls the floating node to a specific state by using the node controller 24, and thus, a voltage of a gate line can be stabilized irrespective of noise. Also, according to the present invention, a pull-up transistor and a pull-down transistor may be turned off for a certain time by using the node controller 24, thereby enhancing the lifetime and reliability of each of the TFTs. Also, according to the present invention, the node controller 24 removes residual electric charges when the supply of power is stopped, thereby enhancing the lifetime of each of the TFTs.

Particularly, in the above-described embodiments, since the voltage of the gate line is stabilized by the node controller 24, the voltage of the gate line can be stabilized even in a period where a data voltage is not output.

To provide an additional description, the node controller 24 to be described below may be applied to each of the stages configuring the gate driver 120 applied to the present invention, and thus, the voltage of the gate line can be stabilized even in a period where the scan signal is not output to the gate line or a period where the data voltage is not output to the data line.

First, referring to FIG. 17, a stage applied to the present invention includes a pull-up transistor Tpu, a pull-down transistor Tpd, a driver 22, and the node controller 24. The pull-up transistor Tpu is connected between a first signal line and an output terminal 20. Here, a clock signal CLK or a high-level voltage VDD is supplied to the first signal line. A gate of the pull-up transistor Tpu is connected to a first node N1, namely, a Q node. The pull-up transistor Tpu supplies the high-level voltage VDD to the output terminal 20 according to a voltage of the first node N1.

The pull-down transistor Tpd is connected between the output terminal 20 and a second signal line through which a low-level voltage VSS is supplied. Also, a gate of the pull-down transistor Tpd is connected to a second node N2, namely, a QB node. The pull-down transistor Tpd supplies the low-level voltage VSS to the output terminal 20 according to a voltage of the second node N2.

The driver 22 controls the voltage of each of the first and second nodes N1 and N2 according to signals supplied through one or more signal lines. The driver 22 may control the voltage of each of the first and second nodes N1 and N2 to alternately turn on or off the pull-up transistor Tpu and the pull-down transistor Tpd.

The node controller 24 controls the voltage of each of the first and second nodes N1 and N2 and a voltage at the output terminal 20 separately from the driver 22. For example, the node controller 24 may supply a certain voltage (for example, the low-level voltage VSS) to the first node N1, the second node N2, and the output terminal 20 according to a control signal CS.

When the low-level voltage VSS is supplied to the first node N1 and the second node N2, the pull-up transistor Tpu and the pull-down transistor Tpd are set to a turn-off state. Also, when a voltage of a low-level voltage source is supplied to the output terminal 20, the output terminal 20 holds the low-level voltage VSS.

Referring to FIG. 18, the node controller 24 includes first to third transistors T1 to T3.

The first transistor T1 is connected between a first node N1 and a low-level voltage source, and the second transistor T2 is connected between a second node N2 and the low-level voltage source. The third transistor T3 is connected between an output terminal 20 and the low-level voltage source. The first to third transistors T1 to T3 of the node controller 24 are turned on or off according to a control signal CS.

The control signal CS may be set to a low-level voltage VSS, a high-level voltage VDD, a voltage equal to or higher than the high-level voltage VDD, or a certain voltage between the low-level voltage VSS and the high-level voltage VDD.

To provide an additional description, the node controller 24 supplies the low-level voltage VSS to the first node N1 or the second node N2, which is maintained in a floating state, according to the control signal CS, thereby preventing an abnormal signal from being supplied to the first node N1 or the second node N2.

Therefore, in the above-described embodiment of the present invention, the voltage of the gate line can be stably maintained even in a period where an image is not displayed.

Hereinabove, the node controller 24 has been described as being connected to the first node N1 connected to the pull-up transistor Tpu or the second node N2 connected to the pull-down transistor Tpd. However, the node controller 24 may be connected to nodes which are maintained in the floating state, in addition to the first node N1 and the second node N2 and may supply a specific voltage to a floated node. Accordingly, an abnormal signal can be prevented from being supplied to a floated node among nodes configuring a stage, and thus, the voltage of the gate line can be stably maintained.

Those skilled in the art can understand that the present invention can be embodied in another detailed form without changing the technical spirit or the essential features. Therefore, it should be understood that the embodiments described above are exemplary from every aspect and are not restrictive. It should be construed that the scope of the present invention is defined by the below-described claims instead of the detailed description, and the meanings and scope of the claims and all variations or modified forms inferred from their equivalent concepts are included in the scope of the present invention.

The invention claimed is:

1. A display device comprising:
   a gate driver configured to apply a scan signal to a plurality of gate lines at a first period in a first mode, and configured to apply the scan signal to the plurality of gate lines at a second period slower than the first period in a second mode according to a driving speed control signal; and
   a data driver configured to:
      invert a polarity of a data voltage,
      output the data voltage during a scan signal output period, and
      not output the data voltage to a plurality of data lines during a scan signal control period for each frame,
   wherein a period of one frame of the second mode according to the driving speed control signal includes the scan signal output period for outputting the scan signal to the plurality of gate lines and the scan signal control period for not outputting the scan signal to the plurality of gate lines.

2. The display device of claim 1, further comprising:
   a timing controller configured to cut off power supplied to the data driver in the scan signal control period.

3. The display device of claim 2, wherein the data driver comprises an output buffer configured to receive the power to output the data voltage, and
   wherein the timing controller is configured to cut off the power supplied to the output buffer in the scan signal control period.

4. The display device of claim 1, wherein the polarity of the data voltage, output by the data driver, is maintained from the scan signal output period to a subsequent scan signal control period.

5. The display device of claim 4, wherein:
   the data driver comprises a digital-to-analog converter (ADC) configured to convert a digital image signal into an analog image signal, and
   the data driver is configured to prevent an inversion of a polarity of the ADC from the scan signal output period to the subsequent scan signal control period.

6. The display device of claim 5, wherein the polarity of the ADC is controlled by a polarity inversion signal supplied from the timing controller.

7. The display device of claim 1, wherein the gate driver comprises a plurality of stage groups driven by independent external start signals to output the scan signals.

8. The display device of claim 7, wherein each of the plurality of stage groups comprise:
   one stage driven by receiving at least one of the external start signals and outputting the scan signal; and
   one stage driven by receiving the scan signal which is supplied as a start signal from another stage included in a corresponding stage group.

9. The display device of claim 7, wherein a last stage among a plurality of stages included in each of the plurality of stage groups outputs the scan signal and is reset by an external reset signal.

10. The display device of claim 7, wherein:
    each of the plurality of stage groups comprise at least one dummy stage, and
    the dummy stage resets another stage included in a stage group including the at least one dummy stage and is reset by an external reset signal.

11. The display device of claim 9, wherein the gate driver controls an output of the scan signal output from at least one of the plurality of stages according to an enable signal.

12. The display device of claim 11, wherein the enable signal discharges an output terminal of at least one of the plurality of stages to a low-level voltage source.

13. The display device of claim 11, wherein the enable signal is supplied to at least one of the plurality of stages to discharge a clock signal, used as the scan signal, to a low-level voltage source.

14. The display device of claim 11, wherein the gate driver comprises a blocking unit, the blocking unit comprising:
 a first transistor connected to a pull-up transistor and a terminal configured to receive a clock signal which is supplied to at least one of the plurality of stages and is used as the scan signal, the first transistor being turned on or off according to the clock signal; and
 a second transistor connected to a low-level voltage source and the pull-up transistor, the second transistor configured to be turned on or off according to the enable signal.

15. The display device of claim 11, wherein the plurality of stages comprise a plurality of carry stages sequentially generating carry signals and a plurality of scan stages sequentially driven according to the carry signals, at least one of the plurality of scan stages controlling an output of the scan signal according to the enable signal.

16. The display device of claim 9, wherein at least one of the plurality of stages included in the gate driver comprises a node controller, the node controller comprising a node control transistor connected between the low-level voltage source and a node, which is floated in the at least one stage, and turned on or off according to a node control signal.

17. A display device comprising:
 a display area including a first driving area driven at a first frequency and a second driving area driven at a second frequency lower than the first frequency;
 a gate driver configured to apply a scan signal to a plurality of gate lines of the first driving area and the second driving area according to the first frequency and the second frequency; and
 a data driver configured to supply a data voltage, with respect to recharging a plurality of pixels within the second driving area with a certain data voltage, the data voltage supplied from the data driver having an opposite polarity from that of a charged data voltage of the second driving area,
 wherein the data driver is configured to not output the data voltage during a period, where the scan signal is not output to the plurality of gate lines within the second driving area, in one frame period.

18. The display device of claim 17, further comprising:
 a timing controller configured to cut off a power of the data driver during the period, where the scan signal is not output to the plurality of gate lines within the second driving area, in one frame period.

19. The display device of claim 17, wherein the first frequency and the second frequency are determined based on a timing when a plurality of external start signals, in which supplied from a plurality of independent external start signal lines, is applied for starting driving of the gate driver, or a timing and a period when an enable signal is applied for blocking the scan signal, in which generated from the gate driver, is applied to the plurality of gate lines.

* * * * *